United States Patent
Yoneda et al.

(10) Patent No.: US 9,059,704 B2
(45) Date of Patent: Jun. 16, 2015

(54) PROGRAMMABLE LOGIC DEVICE

(75) Inventors: Seiichi Yoneda, Kanagawa (JP); Jun Koyama, Kanagawa (JP); Yutaka Shionoiri, Kanagawa (JP); Masami Endo, Kanagawa (JP); Hiroki Dembo, Kanagawa (JP); Tatsuji Nishijima, Kanagawa (JP); Hidetomo Kobayashi, Kanagawa (JP); Kazuaki Ohshima, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 418 days.

(21) Appl. No.: 13/477,192

(22) Filed: May 22, 2012

(65) Prior Publication Data

US 2012/0311365 A1 Dec. 6, 2012

(30) Foreign Application Priority Data

May 31, 2011 (JP) ................................. 2011-121441

(51) Int. Cl.
*G06F 1/00* (2006.01)
*H03K 19/177* (2006.01)
(Continued)

(52) U.S. Cl.
CPC ........ *H03K 19/173* (2013.01); *H03K 19/17772* (2013.01); *G06F 3/0679* (2013.01)

(58) Field of Classification Search
CPC .............. G06F 3/0679; G06F 12/0238; H01L 29/7869; H01L 29/792; H01L 45/04; H03K 19/17772; H03K 19/094; H03K 19/173
USPC ................................. 713/324; 326/37, 38, 41
See application file for complete search history.

(56) References Cited

U.S. PATENT DOCUMENTS 5,731,856 A   3/1998  Kim et al.
5,744,864 A   4/1998  Cillessen et al.
(Continued)

FOREIGN PATENT DOCUMENTS

EP   1 737 044 A1   12/2006
EP   2 226 847 A2   9/2010
(Continued)

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center (w/full English language translation).

(Continued)

*Primary Examiner* — Jaweed A Abbaszadeh
*Assistant Examiner* — Xuxing Chen
(74) *Attorney, Agent, or Firm* — Fish & Richardson P.C.

(57) ABSTRACT

An object is to provide a programmable logic device configured to keep a connection state of logic circuits even while power supply voltage is stopped. The programmable logic device includes arithmetic circuits each of whose logic state can be changed; a configuration changing circuit changing the logic states of the arithmetic circuits; a power supply control circuit controlling supply of power supply voltage to the arithmetic circuits; a state memory circuit storing data on the logic states and data on states of the power supply voltage of the arithmetic circuits; and an arithmetic state control circuit controlling the configuration changing circuit and the power supply control circuit in accordance with the data stored in the state memory circuit. A transistor in which a channel formation region is formed in an oxide semiconductor layer is provided between the configuration changing circuit and each of the arithmetic circuits.

18 Claims, 27 Drawing Sheets

(51) Int. Cl.
*H03K 19/173* (2006.01)
*G06F 3/06* (2006.01)

(56) References Cited

U.S. PATENT DOCUMENTS

| | | | |
|---|---|---|---|
| 6,057,707 A | 5/2000 | Schleicher et al. | |
| 6,127,702 A | 10/2000 | Yamazaki et al. | |
| 6,130,553 A | 10/2000 | Nakaya | |
| 6,172,521 B1 | 1/2001 | Motomura | |
| 6,294,274 B1 | 9/2001 | Kawazoe et al. | |
| 6,314,016 B1* | 11/2001 | Takasu | 365/145 |
| 6,363,004 B1 | 3/2002 | Kang et al. | |
| 6,384,628 B1 | 5/2002 | Lacey et al. | |
| 6,482,658 B2 | 11/2002 | Kang et al. | |
| 6,563,174 B2 | 5/2003 | Kawasaki et al. | |
| 6,727,522 B1 | 4/2004 | Kawasaki et al. | |
| 6,924,663 B2 | 8/2005 | Masui et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,428,160 B2 | 9/2008 | Kang | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,750,671 B2 | 7/2010 | Kang | |
| 7,750,678 B2 | 7/2010 | Kang | |
| 7,768,313 B2 | 8/2010 | Kang | |
| 7,782,085 B2 | 8/2010 | Kang | |
| 7,859,303 B2 | 12/2010 | Kang | |
| 7,924,058 B2 | 4/2011 | Kang | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0196680 A1* | 10/2004 | Kang | 365/49 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0238533 A1* | 10/2008 | Kato | 327/535 |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0175646 A1 | 7/2011 | Takemura et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-312701 A | 11/2004 |
| WO | 2004/114391 A1 | 12/2004 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Ihun Song et al.; "Short Channel Characteristics of Gallium—Indium—Zinc—Oxide Thin Film Transistors for Three-Dimensional Stacking Memory"; IEEE Electron Device Letters; Jun. 2008; pp. 549-552; vol. 29, No. 6.

(56) References Cited

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; An Experimental High-Density DRAM Cell with a Built-in Gain Stage; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFe2O4, and YB2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

(56) References Cited

OTHER PUBLICATIONS

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors For High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss For White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692..

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

● In
☾ Sn
☽ Zn
• O

PROGRAMMABLE LOGIC DEVICE

BACKGROUND OF THE INVENTION

1. Field of the Invention

The present invention relates to a programmable logic device in which a connection state can be kept even while power is not supplied.

2. Description of the Related Art

Since a design of a logic circuit in a programmable logic device (PLD) can be changed by a user after the PLD is released on the market, the PLD is used in a variety of products from a prototype to a mass-produced product.

A field programmable gate array (FPGA) is a typical PLD. The FPGA includes a plurality of logic circuits, and on and off of a switch which changes a connection state of the logic circuits are controlled in accordance with data (configuration data) stored in a memory portion. Thus, a logic state of the FPGA can be changed even after its manufacture.

In recent years, a programmable logic device in which a connection state of logic circuits can be kept even while power supply voltage is not supplied has been actively researched and developed (e.g., Patent Document 1).

REFERENCE

Patent Document

[Patent Document 1] Japanese Published Patent Application No. 2004-312701

SUMMARY OF THE INVENTION

In the structure disclosed in Patent Document 1, a memory element including a ferroelectric material is used in a memory portion for holding configuration data in a programmable logic device.

However, it is necessary to change a phase of a ferroelectric material included in a memory element at the time of writing configuration data, and the number of times of rewriting is limited. Accordingly, deterioration of the memory element due to repeated rewriting of configuration data is a problem.

In view of the above, it is an object of an embodiment of the present invention to provide a programmable logic device in which deterioration of a memory element due to repeated rewriting of configuration data can be reduced and a connection state of logic circuits can be kept even while power supply voltage is not supplied.

Further, it is an object of an embodiment of the present invention to provide a programmable logic device in which improvement in processing speed and reduction in power consumption at the time of switching between stop and restart of supply of power supply voltage are achieved.

An embodiment of the present invention is a programmable logic device including a plurality of arithmetic circuits each of whose logic state can be changed by changing a conduction state of a switch transistor in accordance with configuration data; a configuration changing circuit for changing the logic state of each of the plurality of arithmetic circuits by rewriting the configuration data to each of the plurality of arithmetic circuits; a power supply control circuit which controls supply of power supply voltage to the plurality of arithmetic circuits and stop of the power supply voltage; a state memory circuit which stores data of the plurality of arithmetic circuits; and an arithmetic state control circuit which controls the configuration changing circuit and the power supply control circuit in accordance with the data. A transistor which is connected to a gate of the switch transistor and in which a channel formation region is formed in an oxide semiconductor layer is provided between the configuration changing circuit and each of the arithmetic circuits. The configuration data is held in the gate of the switch transistor while supply of power supply voltage from the power supply control circuit is stopped.

An embodiment of the present invention is a programmable logic device including a plurality of arithmetic circuits each of whose logic state can be changed by changing a conduction state of a switch transistor in accordance with configuration data; a configuration changing circuit for changing the logic state of each of the plurality of arithmetic circuits by rewriting the configuration data to each of the plurality of arithmetic circuits; a power supply control circuit which controls supply of power supply voltage to the plurality of arithmetic circuits and stop of the power supply voltage; a state memory circuit which stores data on configuration, data on a state of supply of power, data on use frequency, and data on last use of each of the plurality of arithmetic circuits; and an arithmetic state control circuit which controls the configuration changing circuit and the power supply control circuit in accordance with the data on the configuration, the data on the state of supply of power, the data on the use frequency, and the data on the last use. A transistor which is connected to a gate of the switch transistor and in which a channel formation region is formed in an oxide semiconductor layer is provided between the configuration changing circuit and each of the arithmetic circuits. The configuration data is held in the gate of the switch transistor while supply of power supply voltage from the power supply control circuit is stopped.

In an embodiment of the present invention, it is preferable that the data on the last use be updated on the basis of a timer circuit included in the arithmetic state control circuit in the programmable logic device.

In an embodiment of the present invention, in the programmable logic device, it is preferable that the logic states of the plurality of arithmetic circuits be searched on the basis of the data on the configuration and that the configuration changing circuit rewrite the configuration data in accordance with a search result.

In an embodiment of the present invention, in the programmable logic device, it is preferable that the states of supply of power of the plurality of arithmetic circuits be searched and that the power supply control circuit control supply of power supply voltage to the arithmetic circuits in accordance with a search result.

In an embodiment of the present invention, it is preferable that the configuration changing circuit in the programmable logic device rewrite the configuration data on the basis of the data on the use frequency and the data on the last use.

In an embodiment of the present invention, it is preferable that the power supply control circuit in the programmable logic device control supply of power supply voltage to the arithmetic circuits in accordance with the data on the use frequency and the data on the last use.

According to an embodiment of the present invention, deterioration of a memory element due to repeated rewriting of configuration data can be reduced. Further, a connection state of logic circuits can be kept even while power supply voltage is not supplied.

Further, according to an embodiment of the present invention, in a programmable logic device, improvement in processing speed and reduction in power consumption at the time of switching between stop and restart of supply of power supply voltage can be achieved.

DETAILED DESCRIPTION OF THE INVENTION

Figure 1A:
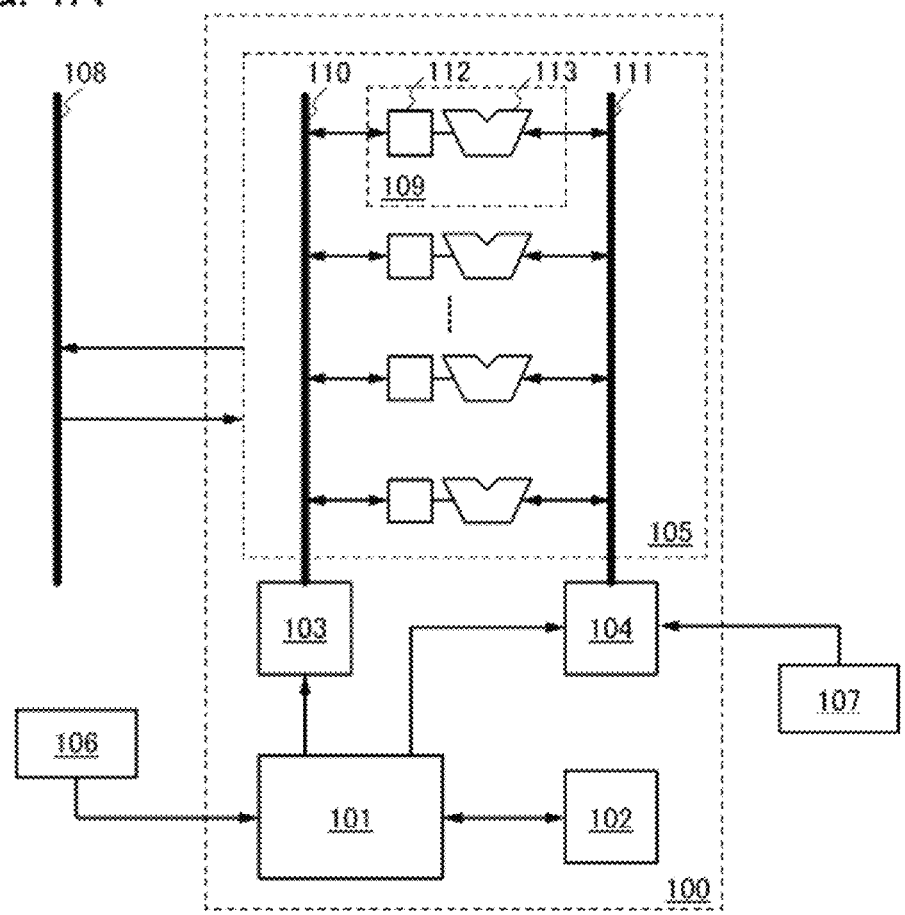
FIGS. 1A and 1B are each a block diagram of a memory circuit.

Embodiments of the present invention will be hereinafter described with reference to the accompanying drawings. However, the present invention can be carried out in many different modes, and it is easily understood by those skilled in the art that modes and details of the present invention can be modified in various ways without departing from the spirit and scope of the present invention. Therefore, the present invention should not be construed as being limited to the following description of the embodiments. Note that in the structures of the present invention described below, identical portions are denoted by the same reference numerals in different drawings.

Note that the size, the thickness of a layer, signal waveform, and a region in structures illustrated in the drawings and the like in the embodiments are exaggerated for simplicity in some cases. Therefore, embodiments of the present invention are not limited to such scales.

Note that when it is explicitly described that "A and B are connected", the case where A and B are electrically connected, the case where A and B are functionally connected, and the case where A and B are directly connected are included therein.

Note that, in this specification, the terms "first" to "n-th (n is a natural number)" are used only to prevent confusion between components, and thus do not limit the number of components.

Embodiment 1

In this embodiment, a circuit structure of a programmable logic device according to an embodiment of the disclosed invention will be described with reference to FIGS. 1A and 1B, FIG. 2, FIG. 3, FIG. 4, and FIG. 5.

FIG. 1A illustrates a structure of a programmable logic device. A programmable logic device 100 includes an arithmetic state control circuit 101, a state memory circuit 102, a configuration changing circuit 103, a power supply control circuit 104, and an arithmetic circuit portion 105.

The arithmetic state control circuit 101 controls the configuration changing circuit 103 and the power supply control circuit 104 in accordance with an instruction signal (command signal) from a command decoder circuit 106 and data stored in the state memory circuit 102. Note that the command decoder circuit 106 analyzes a signal from the outside of the programmable logic device 100 and sends the instruction signal corresponding to the signal from the outside to the arithmetic state control circuit 101.

The state memory circuit 102 stores data on states of a plurality of arithmetic circuits 109 (also referred to as an arithmetic and logic unit (ALU) or an ALU circuit) in the arithmetic circuit portion 105. For example, the state memory circuit 102 stores data on configuration, data on a state of supply of power, data on use frequency, and data on last use of each of the plurality of arithmetic circuits 109.

Note that the configuration means a logic state of the arithmetic circuit 109 on the basis of configuration data written to the arithmetic circuit 109. The state of supply of power means whether or not power supply voltage is supplied to each of the arithmetic circuits 109. The use frequency means the counted number of arithmetic processes performed by the arithmetic circuit 109 after the logic state of the arithmetic circuit 109 is changed. As for the last use, time at which the arithmetic circuit 109 is used for the last time after the logic state of the arithmetic circuit 109 is changed is stored.

The configuration changing circuit 103 rewrites configuration data to each of the arithmetic circuits 109 in accordance with control by the arithmetic state control circuit 101. Specifically, the configuration changing circuit 103 stores some pieces of configuration data by which the logic state of the arithmetic circuit 109 can be change, and outputs necessary configuration data to a given arithmetic circuit in accordance with a control signal from the arithmetic state control circuit 101.

The power supply control circuit 104 controls whether power supply voltage from a power supply circuit 107 is supplied to each of the arithmetic circuits 109 or the power supply voltage is stopped in accordance with control by the arithmetic state control circuit 101. Note that switching between supply and stop of the power supply voltage is controlled in accordance with data stored in the state memory circuit 102.

Data is input to and output from the arithmetic circuit portion 105 through a data input/output bus 108. The arithmetic circuit portion 105 includes the plurality of arithmetic circuits 109. Each of the plurality of arithmetic circuits 109 is connected to a configuration data bus 110 for inputting configuration data from the configuration changing circuit 103 to the plurality of arithmetic circuits 109. Further, each of the plurality of arithmetic circuits 109 is connected to a power supply voltage bus 111 for inputting power supply voltage from the power supply control circuit 104 to the plurality of arithmetic circuits 109.

Each of the plurality of arithmetic circuits 109 includes a memory circuit 112 capable of storing configuration data and a switch arithmetic circuit 113 capable of switching a logic state by a switch transistor whose conduction state can be changed in accordance with the configuration data stored in the memory circuit 112.

Note that the arithmetic circuits 109 may be arranged in matrix and the configuration data bus 110 and the power supply voltage bus 111 may extend in the row direction or in the column direction between the arithmetic circuits 109. Note that the arithmetic circuits 109 are not necessarily arranged in matrix. For example, the arithmetic circuits 109 may be provided adjacent to each other in the row direction or in the column direction and the configuration data bus 110 and the power supply voltage bus 111 may extend in the row direction or in the column direction.

Figure 1B:
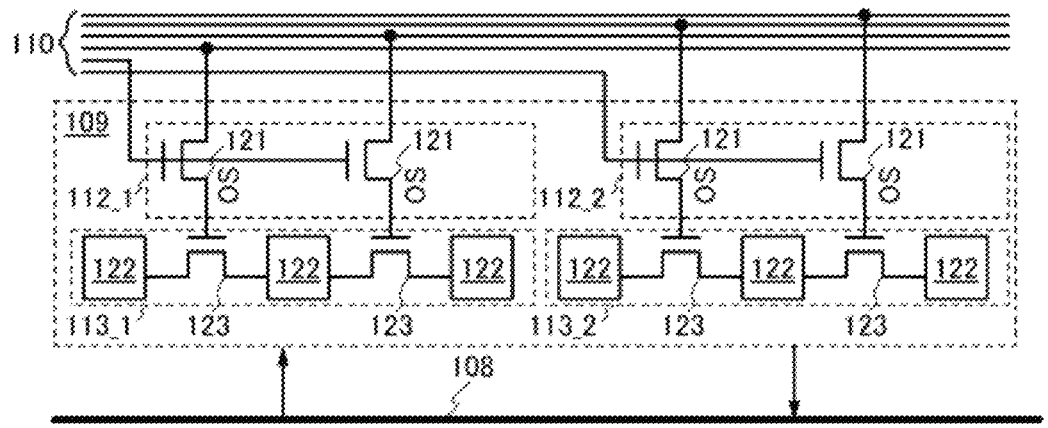

Next, a detailed structure of the arithmetic circuit 109 in FIG. 1A is described with reference to FIG. 1B. The arithmetic circuit 109 in FIG. 1B includes a plurality of memory circuits 112 and a plurality of switch arithmetic circuits 113. FIG. 1B illustrates the structure including a memory circuit 112_1, a memory circuit 112_2, a switch arithmetic circuit 113_1, and a switch arithmetic circuit 113_2. The configuration data bus 110 includes a plurality of wirings so that the memory circuits 112_1 and 112_2 are supplied with different pieces of configuration data. Data is input to each of the switch arithmetic circuits 113_1 and 113_2 through the data input/output bus 108, and data based on the logic state of each of the switch arithmetic circuits 113_1 and 113_2 is output through the data input/output bus 108.

Each of the memory circuits 112_1 and 112_2 includes transistors 121 in each of which a channel formation region is formed in an oxide semiconductor layer. Further, each of the switch arithmetic circuits 113_1 and 113_2 includes a plurality of logic circuits 122 and switch transistors 123 provided for the respective transistors 121. The switch transistor 123 can control a connection state between the logic circuits 122 by control of its conduction state. By control of the connection state, the logic states of the switch arithmetic circuits 113_1 and 113_2 can be changed.

Note that each of the transistors 121 included in the memory circuits 112_1 and 112_2 can hold a gate potential of the switch transistor 123 because of small off-state current of the transistor 121. Therefore, with the structure in FIG. 1B, the connection state between the logic circuits 122 can be kept even while the power supply voltage is not supplied.

Further, in the structure in FIG. 1B, a gate potential of a switch transistor is held because of small off-state current of a transistor, so that configuration data can be held by holding of the potential. Accordingly, deterioration of a memory element can be reduced in the structure of FIG. 1B in which rewriting and holding of configuration data is performed by switching between on and off of the transistor, as compared to a structure in which rewriting and holding of configuration data is performed by repeated structure changes.

Note that in this specification, the off-state current is a current that flows between a source and a drain when a transistor is off. In the case of an n-channel transistor (whose threshold voltage is, for example, approximately 0 V to 2 V), off-state current refers to current flowing between a source and a drain when negative voltage is applied between a gate and the source.

In this embodiment, a transistor in which a channel formation region is formed in an oxide semiconductor layer is used so that off-state current of the transistor 121 included in each of the memory circuits 112_1 and 112_2 is reduced as much as possible. Note that in the drawings, as illustrated in FIG. 1B, "OS" is written in order to indicate that the transistor 121 is a transistor in which a channel formation region is formed in an oxide semiconductor layer.

An oxide semiconductor preferably contains at least indium (In) or zinc (Zn). In particular, In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. Moreover, silicon oxide may be included in the above oxide semiconductor. Here, for example, an In—Ga—Zn-based oxide means an oxide containing indium (In), gallium (Ga), and zinc (Zn) as its main components and there is no particular limitation on the ratio of In:Ga:Zn. The In—Ga—Zn-based oxide may contain a metal element other than In, Ga, and Zn. Here, the amount of oxygen in the above oxide semiconductor preferably exceeds the stoichiometric proportion of oxygen. When the amount of oxygen exceeds the stoichiometric proportion, generation of carriers which results from oxygen vacancies in the oxide semiconductor film can be suppressed.

Alternatively, a material represented by $InMO_3(ZnO)_m$ (m>0, and m is not an integer) may be used as an oxide semiconductor. Note that M represents one or more metal elements selected from Ga, Fe, Mn, and Co. Alternatively, as the oxide semiconductor, a material represented by $In_3SnO_5(ZnO)_n$ (n>0, and n is an integer) may be used.

However, without limitation to the materials given above, a material with an appropriate composition may be used depending on needed semiconductor characteristics (e.g., field-effect mobility, the threshold voltage, and variation). In order to obtain the needed semiconductor characteristics, it is preferable that the carrier density, the impurity concentration, the defect density, the atomic ratio of a metal element to oxygen, the interatomic distance, the density, and the like be set to appropriate values.

For example, high mobility can be obtained relatively easily in the case where an In—Sn—Zn-based oxide is used. However, the mobility can be increased by reducing the defect density in the bulk also in the case where an In—Ga—Zn-based oxide is used.

The oxide semiconductor may be either single crystal or non-single-crystal. In the case where the oxide semiconductor is non-single-crystal, the oxide semiconductor is preferably polycrystal with which a field-effect mobility higher than that of an amorphous oxide semiconductor can be expected. Alternatively, in the case where the oxide semiconductor is non-single-crystal, the oxide semiconductor may be amorphous. Further, the oxide semiconductor may have an amorphous structure including a portion having crystallinity. That is, the oxide semiconductor may be amorphous, and it is preferable that the oxide semiconductor have a non-amorphous structure including a crystalline component in the oxide semiconductor in order to improve the field-effect mobility or reliability of the transistor.

Note that a surface of the oxide semiconductor is preferably flat. This is because when a transistor is formed using an oxide semiconductor film having a flat surface, interface scattering can be reduced, and relatively high mobility can be obtained relatively easily.

In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that Ra is obtained by expanding centerline average roughness, which is defined by JIS B 0601, into three dimensions so as to be applicable to a surface. Moreover, Ra can be expressed as average value of the absolute values of deviations from a reference surface to a specific surface and is defined by the following formula (1).

[Formula 1]

$$Ra = \frac{1}{S_0} \int_{y_1}^{y_2} \int_{x_1}^{x_2} |f(x, y) - Z_0| dx dy \quad (1)$$

Note that in the formula (1), $S_0$ represents the area of a measurement surface (a quadrangular region defined by four points represented by the coordinates $(x_1,y_1)$, $(x_1,y_2)$, $(x_2,y_1)$, and $(x_2,y_2)$), and $Z_0$ represents average height of the measurement surface. Further, Ra can be measured using an atomic force microscope (AFM).

In a transistor whose channel formation region is formed in an oxide semiconductor layer which is highly purified by drastic removal of hydrogen contained in the oxide semiconductor, the off-state current density can be 100 zA/μm or less, preferably 10 zA/μm or less, more preferably 1 zA/μm or less. Thus, the off-state current of the transistor is extremely smaller than that of the transistor including silicon with crystallinity. As a result, even when the transistor 121 is in an off state, the gate potential of the switch transistor 123 can be held for a long time.

The concentration of alkali metals or alkaline earth metals in the oxide semiconductor is preferably lower than or equal to $1 \times 10^{18}$ atoms/cm$^3$, more preferably lower than or equal to $2 \times 10^{16}$ atoms/cm$^3$. This is because carriers might be generated when an alkali metal or an alkaline earth metal is bonded to an oxide semiconductor, which causes an increase in the off-state current of the transistor.

The oxide semiconductor may contain nitrogen at a concentration of lower than or equal to $5 \times 10^{18}$ atoms/cm$^3$.

A material which can realize off-state current characteristics equivalent to those of the oxide semiconductor material may be used instead of the oxide semiconductor material. For example, a wide gap material like silicon carbide (more specifically, a semiconductor material whose energy gap Eg is larger than 3 eV) can be used. A MEMS switch, for example, may be used instead of a transistor to break connection between wirings, whereby the gate potential of the switch transistor 123 can be held.

Figure 2:
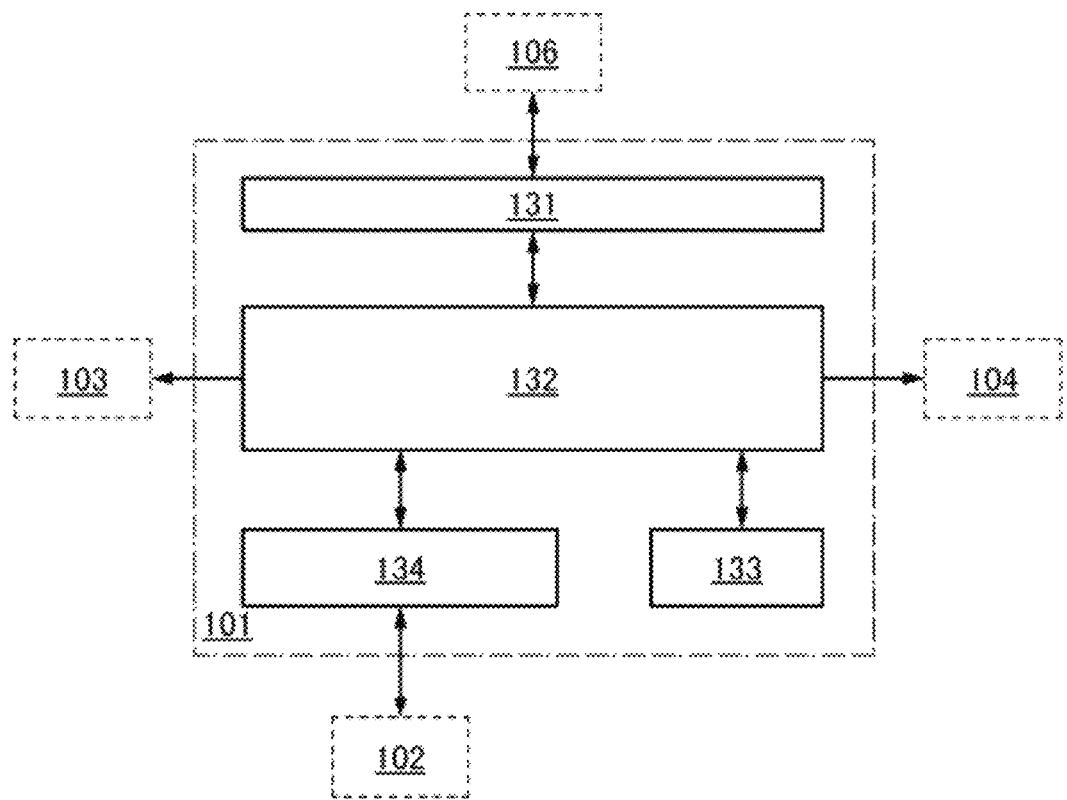
FIG. 2 is a block diagram of an arithmetic state control circuit.

Next, a detailed structure of the arithmetic state control circuit 101 illustrated in FIG. 1A is described with reference to FIG. 2. The arithmetic state control circuit 101 in FIG. 2 includes an input/output portion 131, a control circuit portion 132, a timer circuit 133, and a reading/writing control circuit 134 for the state memory circuit.

The input/output portion 131 is a circuit to which an instruction signal is input from the command decoder circuit 106 and which outputs the instruction signal to the control circuit portion 132.

The control circuit portion 132 controls the configuration changing circuit 103 and the power supply control circuit 104 in accordance with the instruction signal from the input/output portion 131 and the data stored in the state memory circuit 102 which is input through the reading/writing control circuit 134 for the state memory circuit. For example, in the case of the instruction signal to output an arithmetic result of OR operation of input data as output data, the control circuit portion 132 controls the configuration changing circuit 103 and the power supply control circuit 104 in accordance with data on whether an arithmetic circuit 109 capable of performing the OR operation is present in the arithmetic circuit portion 105, on the basis of the data stored in the state memory circuit 102, data on whether the power supply voltage is supplied to the arithmetic circuit, and the like.

The timer circuit 133 detects the time of the last use when each of the arithmetic circuits 109 performs operation for the last time. The timer circuit 133 may include a counter circuit or the like.

The reading/writing control circuit 134 for the state memory circuit reads stored data for controlling the configuration changing circuit 103 and the power supply control circuit 104 from the state memory circuit 102, and writes data on the last use of the arithmetic circuit 109 in accordance with the instruction signal, on the basis of the timer circuit 133.

Figure 3:
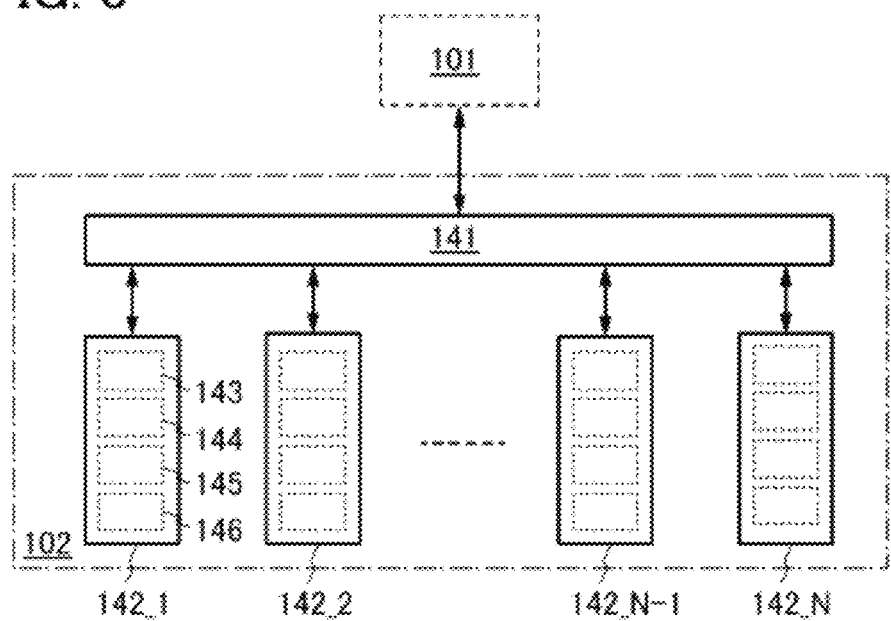
FIG. 3 is a block diagram of a state memory circuit.

Next, a detailed structure of the state memory circuit 102 in FIG. 1A is described with reference to FIG. 3. The state memory circuit 102 in FIG. 3 includes an input/output portion 141 and a plurality of memory circuits 142_1 to 142_N (N is a natural number). Although the plurality of memory circuits 142_1 to 142_N is illustrated in FIG. 3, one memory region in a memory circuit may be divided into plural regions which have functions similar to functions of the plurality of memory circuits 142_1 to 142_N.

The input/output portion 141 is a circuit to which a write signal is input from the control circuit portion 132 and which outputs stored data to the control circuit portion 132.

The state memory circuit 102 includes the plurality of memory circuits 142_1 to 142_N corresponding to the plurality of arithmetic circuits 109 in the arithmetic circuit portion 105 so that data on states of the plurality of arithmetic circuits 109 is stored. Each of the plurality of memory circuits 142_1 to 142_N includes a region 143 storing data on configuration of the corresponding arithmetic circuit 109, a region 144 storing data on a state of supply of power of the corresponding arithmetic circuit 109, a region 145 storing data on the use frequency of the corresponding arithmetic circuit 109, and a region 146 storing data on the last use of the corresponding arithmetic circuit 109. Data is written to each of the regions 143 to 146 by the arithmetic state control circuit 101 and read from each of the regions 143 to 146 by the arithmetic state control circuit 101.

Note that data on a logic state of the arithmetic circuit 109 based on the configuration data written thereto is stored in the region 143 storing the data on the configuration. Data on whether the power supply voltage is supplied to the arithmetic circuit 109 is stored in the region 144 storing the data on the state of supply of power. Data on the counted number of times of performing operation using the arithmetic circuit 109 after the logic state of the arithmetic circuit 109 is changed is stored in the region 145 storing the data on the use frequency. Data on the time when the arithmetic circuit 109 is used after change of the logic state of the arithmetic circuit 109 is stored in the region 146 storing the data on the last use.

Figure 4:
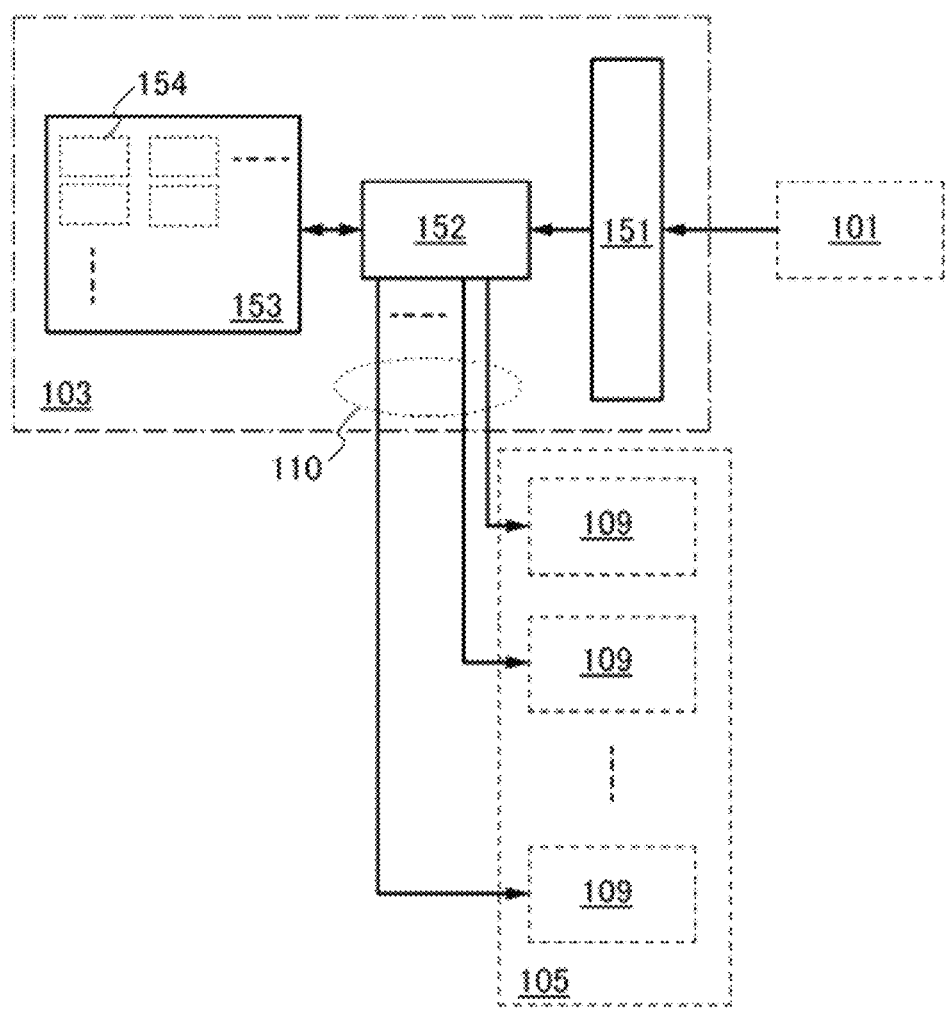
FIG. 4 is a block diagram of a configuration changing circuit.

Next, a detailed structure of the configuration changing circuit 103 in FIG. 1A is described with reference to FIG. 4. The configuration changing circuit 103 in FIG. 4 includes an input/output portion 151, a configuration data writing control circuit 152, and a configuration data memory circuit 153.

The input/output portion 151 is a circuit to which a control signal is input from the arithmetic state control circuit 101 and which outputs the control signal to the configuration data writing control circuit 152.

The configuration data writing control circuit 152 reads configuration data, in accordance with the control signal from the arithmetic state control circuit 101, from the configuration data memory circuit 153 storing some pieces of configuration data by which the logic state of the arithmetic circuit 109 can be changed, and outputs the configuration data to a predetermined arithmetic circuit 109 in the arithmetic circuit portion 105 through the configuration data bus 110.

The configuration data memory circuit 153 includes memory regions 154 each storing configuration data by which the logic state of the arithmetic circuit 109 can be changed. The configuration data memory circuit 153 reads predetermined configuration data in accordance with control by the configuration data writing control circuit 152 and outputs the configuration data to the configuration data writing control circuit 152.

Figure 5:
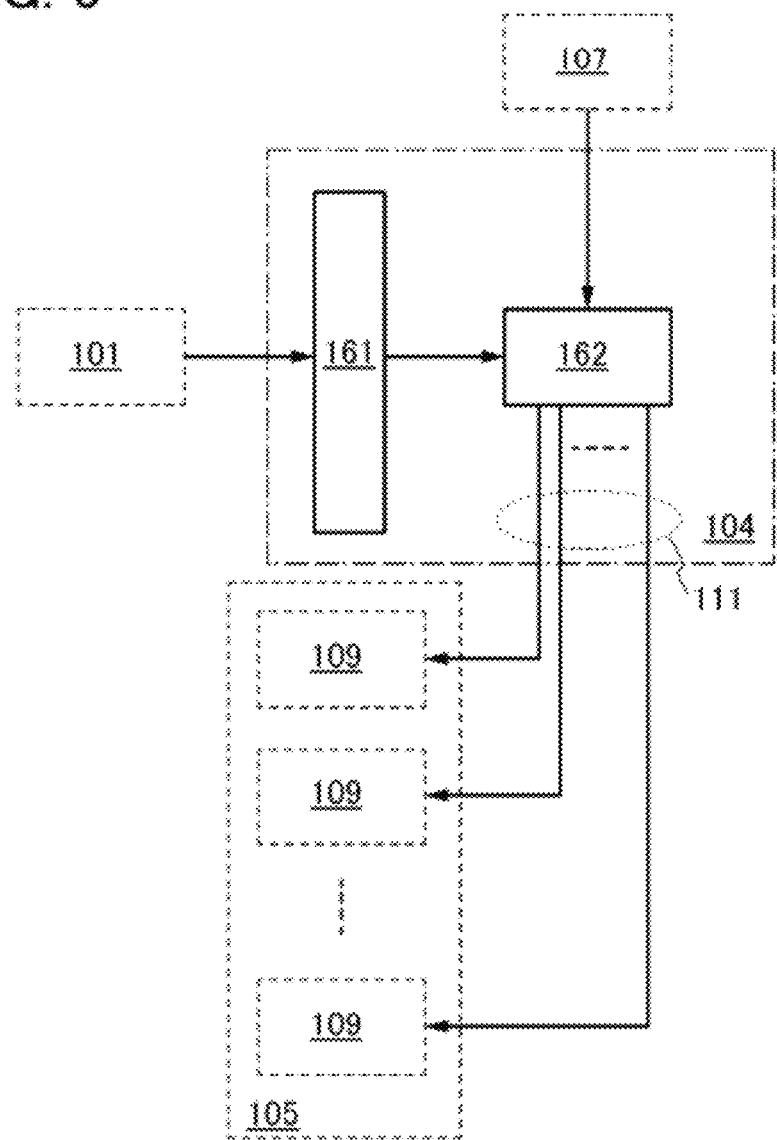
FIG. 5 is a block diagram of a power supply control circuit.

Next, a detailed structure of the power supply control circuit 104 in FIG. 1A is described with reference to FIG. 5. The power supply control circuit 104 in FIG. 5 includes an input/output portion 161 and a power supply switch circuit 162.

The input/output portion 161 is a circuit to which a control signal is input from the arithmetic state control circuit 101 and which outputs the control signal to the power supply switch circuit 162.

The power supply switch circuit 162 controls, in accordance with the control signal from the arithmetic state control circuit 101, whether the power supply voltage from the power supply circuit 107 is supplied to each of the arithmetic circuits 109 in the arithmetic circuit portion 105 or the power supply voltage is stopped. The power supply switch circuit 162 controls supply of the power supply voltage through the power supply bus 111 and stop of the supply of the power supply voltage by changing a conduction state of a switch and the like for controlling individually power supply voltages supplied to the arithmetic circuits 109.

Next, detailed structures of the memory circuit 112_1 and the switch arithmetic circuit 113_1 in the arithmetic circuit portion 105 in FIG. 1B are described with reference to FIG. 6A.

Figure 6A:
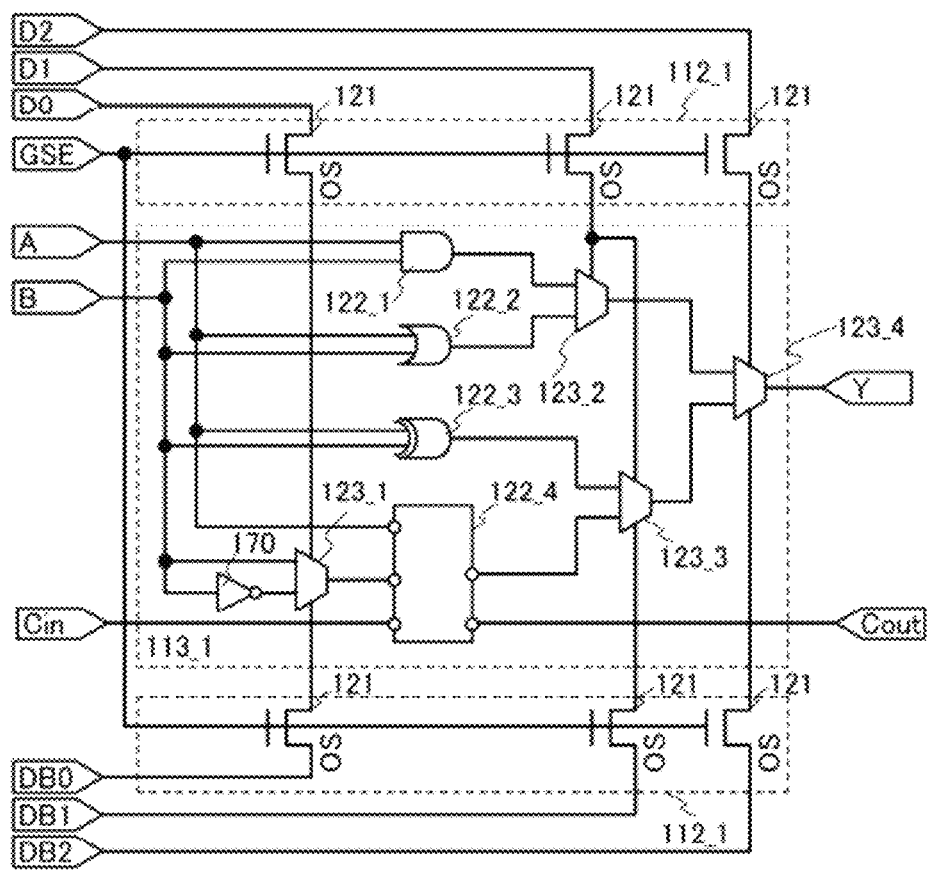
FIGS. 6A to 6C illustrate a circuit structure of a memory circuit.

An example illustrated in FIG. 6A includes, as the switch transistors 123 included in the switch arithmetic circuit 113_1, selector circuits 123_1 to 123_4 each including an analog switch. In this example, three pairs of transistors 121 are provided and signals for controlling conduction states of the analog switches in the selector circuits are supplied as configuration data D0 to D2 and DB0 to DB2. Further, in this example, a gate selection control signal GSE is supplied as a signal for controlling a conduction state of the transistor 121.

Note that the configuration data D0 to D2 and DB0 to DB2 and the gate selection control signal GSE are supplied through the configuration data bus 110 illustrated in FIG. 1A. Note that each signal is either a signal at an H-level potential (H signal) or a signal at an L-level potential (L signal). Note that the L signal is preferably a signal at a ground potential.

Figure 6B:
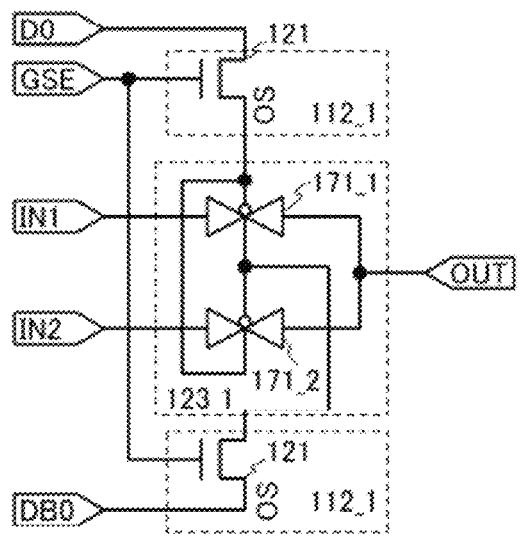

FIG. 6B illustrates an example of a circuit structure of the selector circuit 123_1. The selector circuit 123_1 in FIG. 6B includes an analog switch 171_1 and an analog switch 171_2. Each of the analog switches 171_1 and 171_2 includes an n-channel transistor and a p-channel transistor in combination. Therefore, in the example illustrated in FIG. 6A, in the memory circuit 112_1, a pair of transistors 121 is provided for the selector circuit 123_1. When the configuration data D0 is supplied from one of a source and a drain of one of the pair of the transistors 121 and the configuration data DB0 is supplied from one of a source and a drain of the other of the pair of the transistors 121 and thus the analog switch 171_1 or the analog switch 171_2 is turned on, a signal of an input terminal N1 or a signal of an input terminal IN2 is output to an output terminal OUT.

In the example illustrated in FIG. 6A, a logic circuit 122_1 performing logical AND operation, a logic circuit 122_2 performing logical OR operation, a logic circuit 122_3 performing logical XOR operation, and a logic circuit 122_4 performing add operation are included in the switch arithmetic circuit 113_1. In addition, in the example illustrated in FIG. 6A, an inverter circuit 170 is provided on the input terminal side of the logic circuit 122_4 so that subtraction operation is also performed by the logic circuit 122_4. Note that a signal Cin input to the logic circuit 122_4 is a carry signal in the add operation, and a signal Cout is output from the logic circuit 122_4 if carry exists.

In the example illustrated in FIG. 6A, a connection state is changed by changing the configuration data D0 to D2 and DB0 to DB2 as shown in Table 1; thus, a logic state can be changed. Note that "1" means the H signal and "0" means the L signal in Table 1. The configuration data is changed as shown in Table 1, whereby the conduction states of the selector circuits serving as switch transistors are changed and the logic state can be changed accordingly. Further, data input from input terminals A and B can be obtained as data output from an output terminal Y.

TABLE 1

|  | Configuration data | | | | | |
| --- | --- | --- | --- | --- | --- | --- |
|  | D0 | D1 | D2 | DB0 | DB1 | DB2 |
| AND | 0 | 0 | 0 | 1 | 1 | 1 |
| OR | 0 | 1 | 0 | 1 | 1 | 1 |
| XOR | 0 | 0 | 1 | 1 | 1 | 0 |
| Add | 0 | 1 | 1 | 1 | 0 | 0 |
| Subtraction | 1 | 1 | 1 | 0 | 0 | 0 |

Figure 6C:
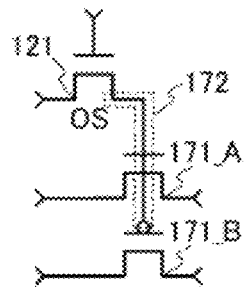

When the transistors (e.g., an n-channel transistor and a p-channel transistor) included in each of the analog switches 171_1 and 171_2 in FIG. 6B are a transistor 171_A and a transistor 171_B, the transistor 121 is connected to gates of the transistors 171_A and 171_B as illustrated in FIG. 6C. As described above, a transistor with small off-state current is used as the transistor 121 included in the memory circuit 112_1 in this embodiment. Accordingly, gate potentials of the transistors 171_A and 171_B in FIG. 6C can be held (at a node 172 in FIG. 6C). Thus, with the structure illustrated in FIG. 6A, connection states of the logic circuits 122 can be held by making the transistors 121 turned off even while power supply voltage is not supplied.

Further, in the structure in FIG. 6C, gate potentials of the transistors 171_A and 171_B are held because of small off-state current of the transistor 121, so that configuration data can be held by holding of the potential. Accordingly, deterioration of a memory element can be reduced in the structure of FIG. 6A in which rewriting and holding of configuration data is performed by switching between on and off of the transistors, as compared to a structure in which rewriting and holding of configuration data is performed by repeated structure changes.

Figure 7:
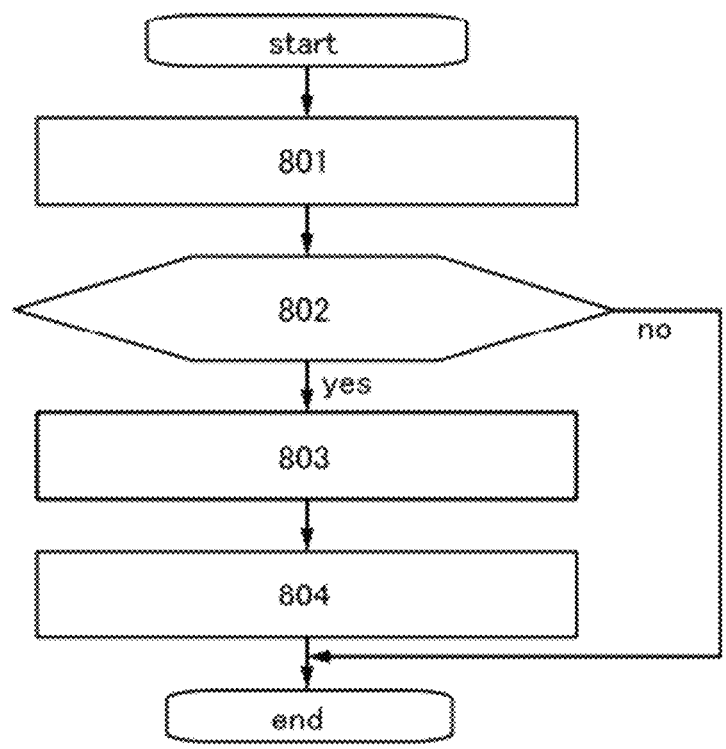
FIG. 7 is a flow chart explaining operation of a programmable logic device.
Figure 8:
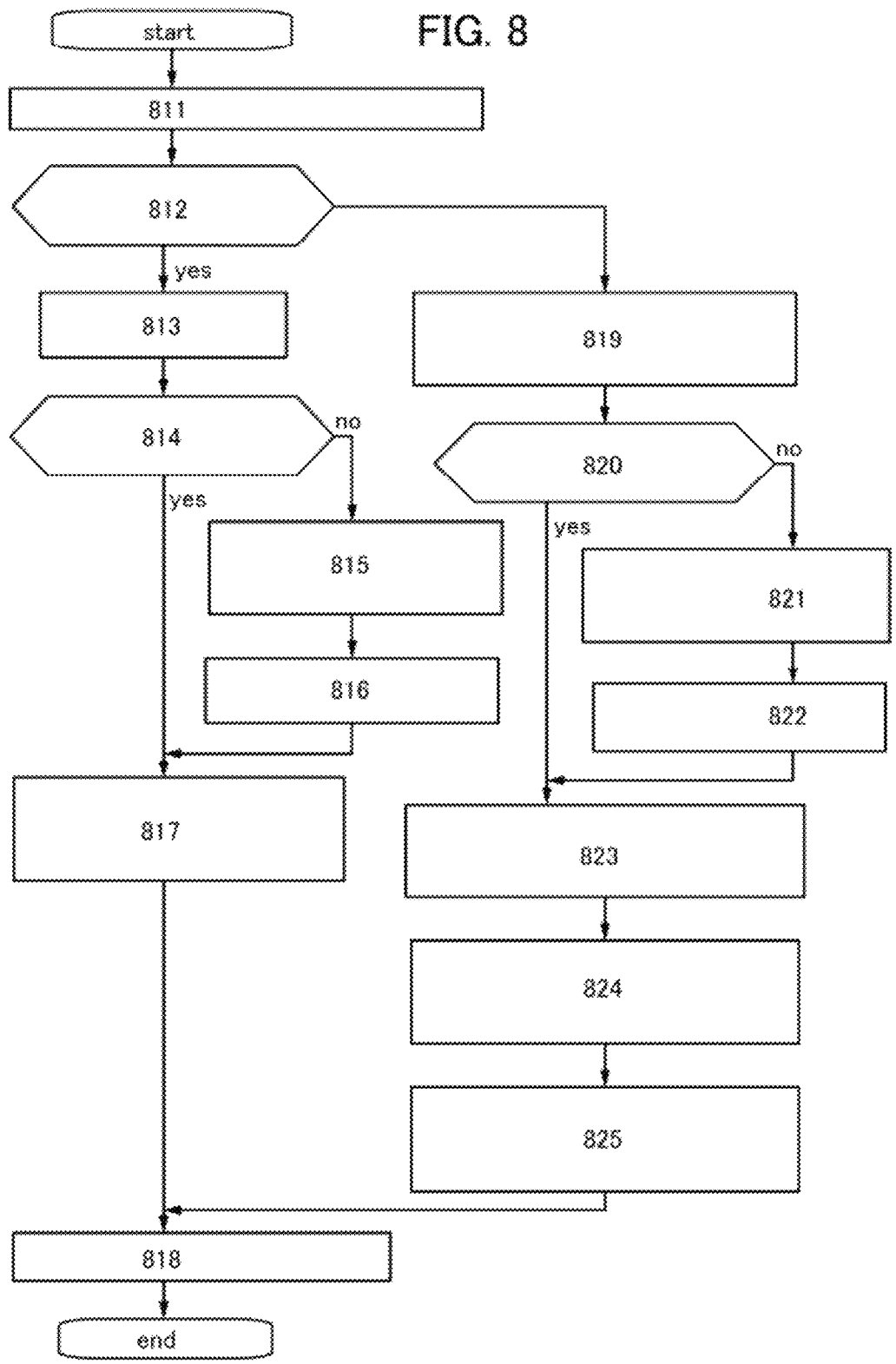
FIG. 8 is a flow chart explaining operation of a programmable logic device.
Figure 9:
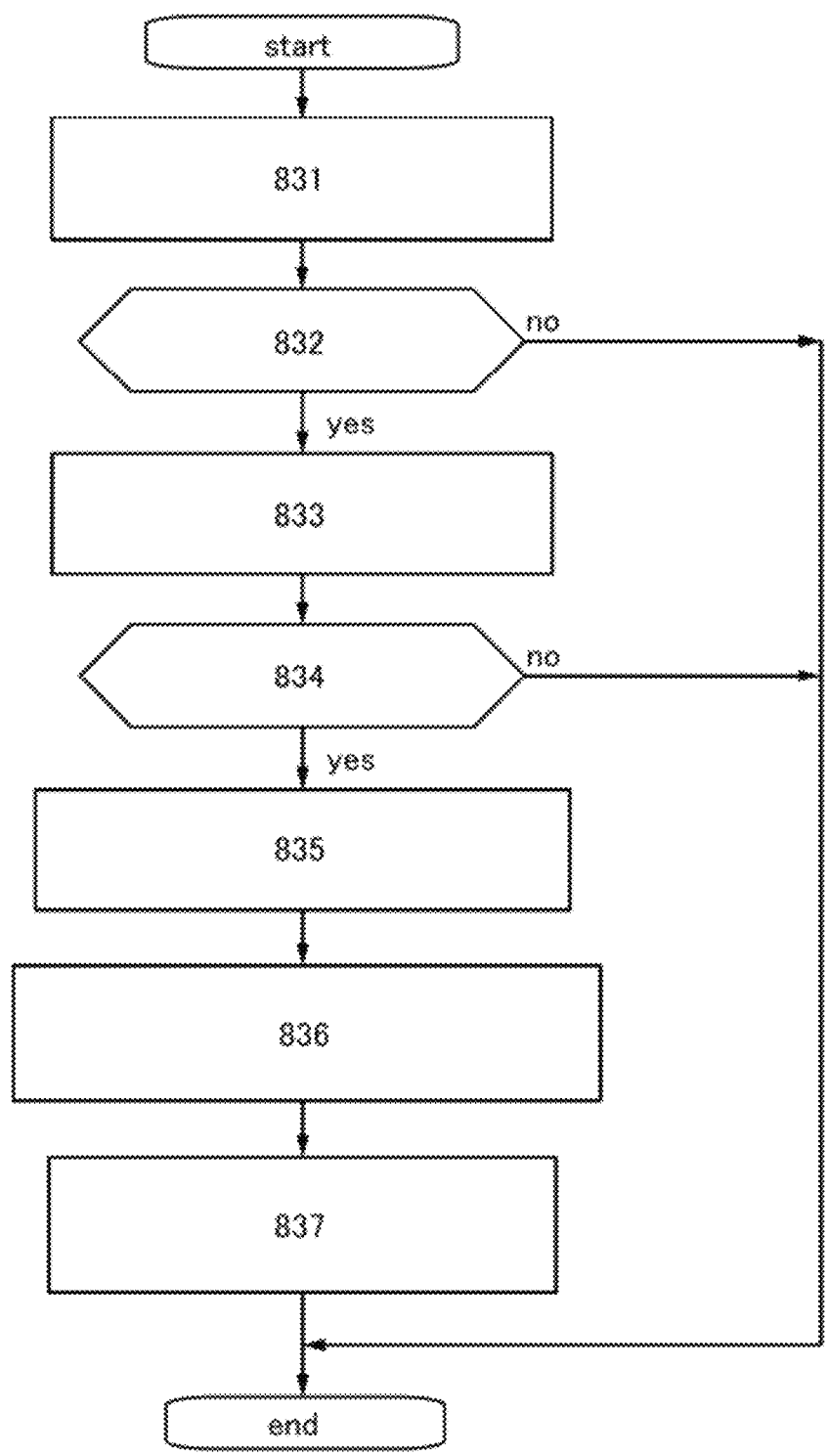
FIG. 9 is a flow chart explaining operation of a programmable logic device.

Next, operation of the programmable logic device 100 in FIG. 1A is described with reference to flowcharts in FIG. 7, FIG. 8, and FIG. 9. Operation to stop supply of power supply voltage to an arithmetic circuit 109 having low use frequency for the purpose of reduction in power consumption is described with reference to the flowchart in FIG. 7.

Note that in this specification, stop of supply of a signal or power supply voltage means that the supply of the signal or the power supply voltage to a wiring for supplying the signal or the power supply voltage is not performed. In addition, in this specification, restart of supply of a signal or power supply voltage means that the supply of the signal or the power supply voltage to a wiring for supplying the signal or the power supply voltage is restarted from a state where the supply of the signal or the power supply voltage is stopped.

The state memory circuit 102 is searched for all pieces of data on the use frequency and all pieces of data on the last use of the arithmetic circuits 109 (step 801).

Next, judgment is made whether the data on the use frequency and the data on the last use of the arithmetic circuit 109 are under a predetermined threshold or not (step 802). Note that the threshold may be changed depending on use condition of the arithmetic circuit portion 105. The threshold is used for detecting an arithmetic circuit which has low use frequency or is intermittently used and for stopping supply of power supply voltage to the detected arithmetic circuit.

In the case where the corresponding arithmetic circuit 109 is detected in the step 802, supply of power supply voltage to the corresponding arithmetic circuit 109 is stopped (step 803). In the case where the corresponding arithmetic circuit 109 is not detected in the step 802, operation is terminated.

After the step 803, data on the state of supply of power of the arithmetic circuit 109 detected in the step 802, which is stored in the state memory circuit 102, is rewritten (step 804).

The above described is the operation to stop supply of power supply voltage to an arithmetic circuit 109 having low use frequency in the programmable logic device. According to an embodiment of the present invention, power consumption of a programmable logic device at a time of switching between stop and restart of supply of power supply voltage can be reduced.

Next, operation to perform arithmetic processing in a state where both an arithmetic circuit 109 to which power supply voltage is supplied and an arithmetic circuit 109 to which power supply voltage is not supplied are in the arithmetic circuit portion 105 is described with reference to the flowchart in FIG. 8.

First, the state memory circuit 102 is searched for data on configuration of an arithmetic circuit 109 (step 811).

Then, judgment is made whether the corresponding configuration of the arithmetic circuit 109 is detected (step 812). Note that the step 812 is for detecting whether an arithmetic circuit 109 in a connection state capable of performing logical OR operation exists in the arithmetic circuits 109 in the case where logical OR operation is preferably performed on input data, for example. Therefore, different operations are performed depending on whether or not the corresponding configuration of the arithmetic circuit 109 is detected.

First, the case where the corresponding arithmetic circuit 109 is detected in the step 812 is described. In this case, the state memory circuit 102 is searched for data on the state of supply of power of the arithmetic circuit 109 (step 813).

Then, judgment is made whether or not power supply voltage is supplied to the corresponding arithmetic circuit 109 (step 814). In the case where the power supply voltage is not supplied to the corresponding arithmetic circuit 109, the data on the state of supply of power of the corresponding arithmetic circuit 109, which is stored in the state memory circuit 102, is changed to data of a state where the power supply voltage is supplied (step 815), and thus the power supply voltage is supplied to the corresponding arithmetic circuit 109 (step 816).

In the state where the power supply voltage is supplied to the corresponding arithmetic circuit 109, data on the use frequency of the corresponding arithmetic circuit 109, which is stored in the state memory circuit 102, is incremented, and the data on the last use is updated (step 817).

Next, data is input to the corresponding arithmetic circuit and predetermined arithmetic processing is performed (step 818).

Now, the case where the corresponding arithmetic circuit 109 is not detected in the step 812 is described. In this case, the state memory circuit 102 is searched for data on the use frequency and data on the last use of the arithmetic circuits 109 so that an arithmetic circuit 109 with low use frequency or long time passing since the last use is detected (step 819).

Next, judgment is made whether or not power supply voltage is supplied to the arithmetic circuit 109 detected in the step 819 (step 820). In the case where the power supply voltage is not supplied to the corresponding arithmetic circuit 109, the data on the state of supply of power of the corresponding arithmetic circuit 109, which is stored in the state memory circuit 102, is changed to data of a state where the power supply voltage is supplied (step 821), and thus the power supply voltage is supplied to the corresponding arithmetic circuit 109 (step 822).

In the state where the power supply voltage is supplied to the arithmetic circuit 109 detected in the step 819, data on the configuration of the corresponding arithmetic circuit 109, which is stored in the state memory circuit 102, is changed to data of configuration which is detected in the step 811 (step 823). Data on the use frequency and data on the last use of the corresponding arithmetic circuit 109 whose configuration is changed in the step 823, which are stored in the state memory circuit 102, are reset (step 824).

Next, configuration data is written to the arithmetic circuit 109 detected in the step 819 so that the configuration thereof is changed to configuration which is detected in the step 811 (step 825).

Next, data is input to the corresponding arithmetic circuit and predetermined arithmetic processing is performed (step 818).

The above described is the operation to perform arithmetic processing in a state where both an arithmetic circuit 109 to which power supply voltage is supplied and an arithmetic circuit 109 to which power supply voltage is not supplied are in the arithmetic circuit portion 105. According to an embodiment of the present invention, switching between stop and restart of power supply voltage can be efficiently performed and thus power consumption can be reduced.

Next, for the purpose of improvement in processing speed, operation to parallelize arithmetic processing by setting arithmetic circuits 109 in the same configuration in the case where the same arithmetic processing is repeated is described with reference to the flowchart in FIG. 9.

First, the state memory circuit 102 is searched for data on the use frequency and data on the last use of the arithmetic circuits 109 so that an arithmetic circuit 109 with high use frequency or an arithmetic circuit 109 which is used recently is detected (step 831).

Different operations are performed depending on whether or not the corresponding arithmetic circuit 109 is detected in the step 831 (step 832). Note that in the case where the corresponding arithmetic circuit 109 is not detected, processing is terminated.

In the case where the corresponding arithmetic circuit 109 is detected in the step 831, the state memory circuit 102 is searched for data on the use frequency and data on the last use of the arithmetic circuits 109 so that an arithmetic circuit 109 with low use frequency or long time passing since the last use is detected (step 833).

Different operations are performed depending on whether or not the corresponding arithmetic circuit 109 is detected in the step 833 (step 834). Note that in the case where the corresponding arithmetic circuit 109 is not detected, processing is terminated.

In the case where the corresponding arithmetic circuit 109 is detected in the step 834, the data on the configuration of the arithmetic circuit 109 detected in the step 832 is copied into the state memory circuit for the arithmetic circuit 109 detected in the step 833 (step 835).

Next, data on the use frequency and data on the last use of the corresponding arithmetic circuit 109 whose configuration is changed in the step 835, which are stored in the state memory circuit 102, are reset (step 836).

Next, configuration data is written to the arithmetic circuit 109 whose configuration state is changed in the step 835 so that the configuration thereof is changed to configuration which is detected in the step 832 (step 837).

The above described is the operation to parallelize arithmetic processing by setting arithmetic circuits 109 in the same configuration state in the case where the same arithmetic processing is repeated in a programmable logic device, for the purpose of improvement in processing speed. According to an embodiment of the present invention, processing speed of a programmable logic device at the time of switching between stop and restart of supply of power supply voltage can be improved.

As described above, according to an embodiment of the present invention, in a programmable logic device, improvement in processing speed and reduction in power consumption at the time of switching between stop and restart of supply of power supply voltage can be achieved.

This embodiment can be combined with any of the other embodiments as appropriate.

Embodiment 2

In this embodiment, a method for manufacturing the transistors included in the programmable logic device in Embodiment 1 will be described with reference to FIGS. 10A to 10D, FIGS. 11A and 11B, FIGS. 12A to 12C, and FIGS. 13A and 13B. As an example, a method for manufacturing the transistor 121, the transistor 171_A, and the transistor 171_B illustrated in FIG. 6C is described. Note that in FIGS. 10A to 10D, FIGS. 11A and 11B, FIGS. 12A to 12C, and FIGS. 13A and 13B, cross-sectional view taken along line A-B corresponds to a cross-sectional view of a region where the transistor 121 in which a channel formation region is formed in an oxide semiconductor, the n-channel transistor 171_A, and the p-channel transistor 171_B are formed, and a cross-sectional view taken along line C-D corresponds to a cross-sectional view of the node 172 at which the one of the source electrode and the drain electrode of the transistor 121 in which a channel formation region is formed in an oxide semiconductor is connected to the gate electrode of the n-channel transistor 171_A. Note that although not directly illustrated, as illustrated in FIG. 6C, the gate electrode of the p-channel transistor 171_B is also connected to the node 172 in this embodiment.

Figure 10A:
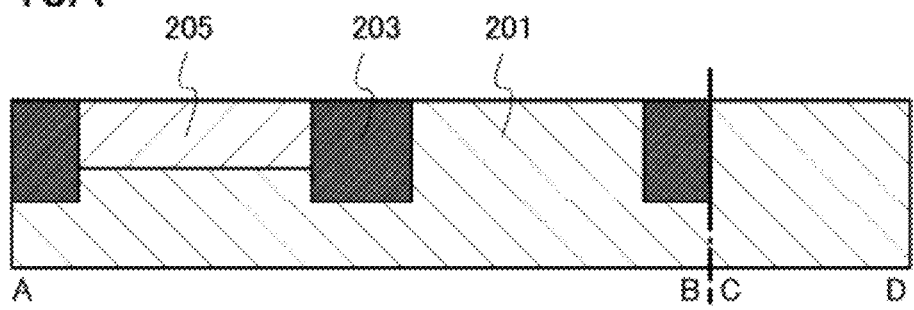
FIGS. 10A to 10D illustrate steps of manufacturing a programmable logic device.

First, as illustrated in FIG. 10A, an element isolation region 203 is formed in an n-type semiconductor substrate 201, and then a p-well region 205 is formed in part of the n-type semiconductor substrate 201.

As the n-type semiconductor substrate 201, a single crystal silicon substrate (a silicon wafer) having n-type conductivity, or a compound semiconductor substrate (e.g., a SiC substrate, a sapphire substrate, or a GaN substrate) can be used.

Instead of the n-type semiconductor substrate 201, the following substrate may be used as a silicon on insulator (SOI) substrate: a so-called separation by implanted oxygen (SIMOX) substrate which is formed in such a manner that after an oxygen ion is implanted into a mirror-polished wafer, an oxide layer is formed at a certain depth from the surface and defects generated in a surface layer are eliminated by high temperature heating; or an SOI substrate formed by a technique called a Smart-Cut method in which a semiconductor substrate is cleaved by utilizing growth of a minute void formed by implantation of a hydrogen ion, by heat treatment, an epitaxial layer transfer (ELTRAN: a registered trademark of Canon Inc.) method, or the like.

The element isolation region 203 is formed by a local oxidation of silicon (LOCOS) method, a shallow trench isolation (STI) method, or the like.

An impurity element imparting p-type conductivity, such as boron, is added to the p-well region 205 at a concentration of approximately $5 \times 10^{15}$ cm$^{-3}$ to $1 \times 10^{16}$ cm$^{-3}$. The p-well region 205 is formed in such a manner that a mask is formed over part of the semiconductor substrate 201, and an impurity element imparting p-type conductivity, such as boron, is added to part of the semiconductor substrate 201.

Note that although the n-type semiconductor substrate is used here, a p-type semiconductor substrate may be used and an n-well region to which an impurity element imparting n-type conductivity, such as phosphorus or arsenic, is added may be formed in the p-type semiconductor substrate.

Figure 10B:
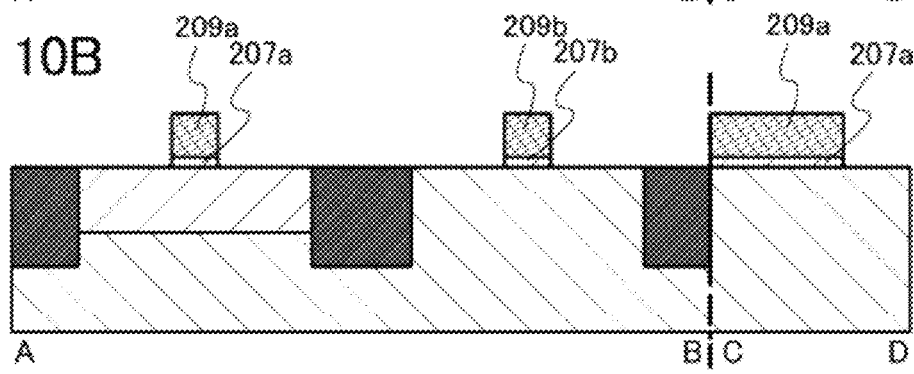

Next, as illustrated in FIG. 10B, a gate insulating film 207a, a gate insulating film 207b, a gate electrode 209a, and a gate electrode 209b are formed over the semiconductor substrate 201.

A surface of the semiconductor substrate 201 is oxidized by heat treatment, so that a silicon oxide film is formed. Alternatively, a silicon oxide film is formed by a thermal oxidation method, and then a surface of the silicon oxide film is nitrided by a nitridation treatment; thus a stacked structure including the silicon oxide film and the silicon film containing oxygen and nitrogen (silicon oxynitride film) is formed. Next, part of the silicon oxide film or the silicon oxynitride film is selectively etched, so that the gate insulating film 207a and the gate insulating film 207b are formed. Alternatively, the gate insulating film 207a and the gate insulating film 207b are formed in such a manner that silicon oxide, silicon oxynitride, metal oxide such as tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like is formed to have a thickness of 5 nm to 50 nm by a CVD method, a sputtering method, or the like, and then part thereof is selectively etched.

It is preferable that the gate electrode 209a and the gate electrode 209b each be formed using a metal selected from tantalum, tungsten, titanium, molybdenum, chromium, niobium, and the like, or an alloy material or a compound material including any of the metals as its main component. Further, polycrystalline silicon to which an impurity such as phosphorus is added can be used. Alternatively, the gate electrode 209a and the gate electrode 209b may have a stacked structure including a metal nitride film and a film of any of the above metals. As the metal nitride, tungsten nitride, molybdenum nitride, or titanium nitride can be used. When the metal nitride film is provided, adhesiveness of the metal film can be increased; accordingly, separation can be prevented.

The gate electrode 209a and the gate electrode 209b are formed in such a manner that a conductive film is formed by a sputtering method, a CVD method, or the like and then part of the conductive film is selectively etched.

Here, the surface of the semiconductor substrate 201 is oxidized by heat treatment, so that a silicon oxide film is formed; a conductive film including a stack of a tantalum nitride film and a tungsten film is formed over the silicon oxide film by a sputtering method; and then part of the silicon oxide film and part of the conductive film are selectively etched. Thus, the gate insulating film 207a, the gate insulating film 207b, the gate electrode 209a, and the gate electrode 209b are formed.

Note that for high integration, a structure in which sidewall insulating layers are not provided on side surfaces of the gate electrode 209a and the gate electrode 209b is preferable. On the other hand, when the characteristics of the transistor have priority, sidewall insulating layers may be provided on the side surfaces of the gate electrode 209a and the gate electrode 209b.

Figure 10C:
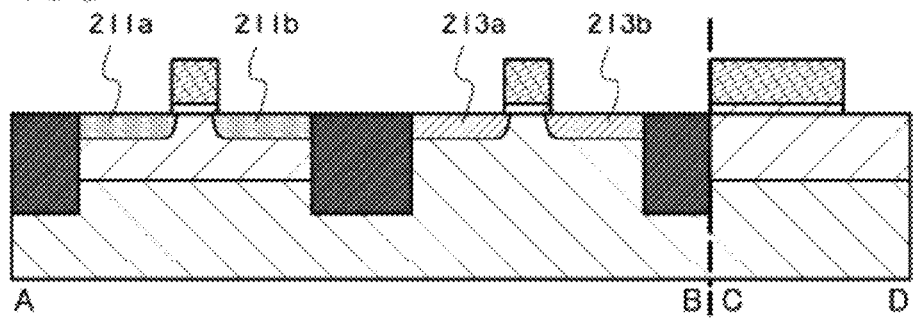

Next, as illustrated in FIG. 10C, an impurity element imparting p-type conductivity is added to the semiconductor substrate 201, so that a p-type impurity region 213a and a p-type impurity region 213b are formed. Further, an impurity element imparting n-type conductivity is added to the p-well region 205, so that an n-type impurity region 211a and an n-type impurity region 211b are formed. The concentration of the impurity element imparting n-type conductivity in the n-type impurity regions 211a and 211b is higher than or equal to $1 \times 10^{19}$/cm$^3$ and lower than or equal to $1 \times 10^{21}$/cm$^3$, and the concentration of the impurity element imparting p-type conductivity in the p-type impurity regions 213a and 213b is higher than or equal to $1 \times 10^{19}$/cm$^3$ and lower than or equal to $1 \times 10^{21}$/cm$^3$. The impurity element imparting n-type conductivity and the impurity element imparting p-type conductivity are added to the p-well region 205 and the semiconductor substrate 201, respectively, by an ion doping method, an ion implantation method, or the like as appropriate.

In the case where sidewall insulating layers are formed on the side surfaces of the gate electrode 209a and the gate electrode 209b, an impurity region having an impurity concentration different from that in the n-type impurity regions 211a and 211b and that in the p-type concentration regions 213a and 213b can be formed in regions overlapping with the sidewall insulating layers.

Figure 10D:
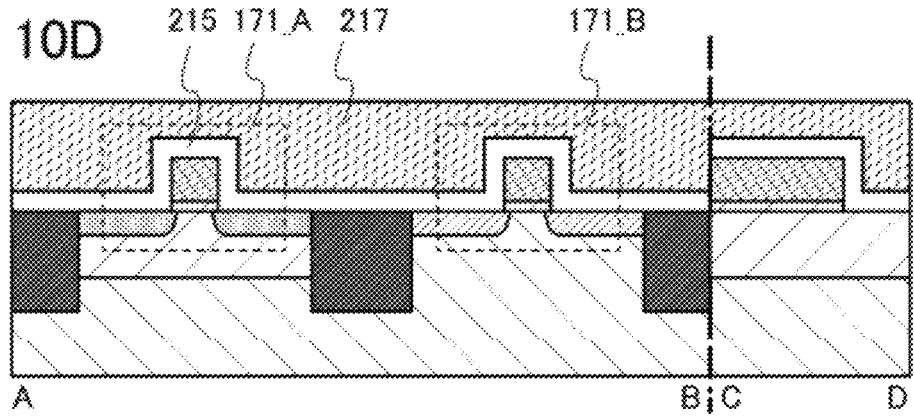

Next, as illustrated in FIG. 10D, an insulating film 215 and an insulating film 217 are formed by a sputtering method, a CVD method, or the like over the semiconductor substrate 201, the element isolation region 203, the gate insulating films 207a and 207b, and the gate electrodes 209a and 209b.

The insulating films 215 and 217 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, a hydrogen content of the insulating film 215 can be increased. Heat treatment is performed using such an insulating film 215, whereby it is possible to hydrogenate the semiconductor substrate, to terminate a dangling bond by hydrogen, and to reduce defects in the semiconductor substrate.

Note that planarity of the insulating film 217 can be high when the insulating film 217 is formed using an inorganic material such as borophosphosilicate glass (BPSG), or an organic material such as polyimide or acrylic.

After the formation of the insulating film 215 or the insulating film 217, heat treatment is performed to activate the impurity elements added to the n-type impurity regions 211a and 211b and the p-type impurity regions 213a and 213b.

Through the above steps, as illustrated in FIG. 10D, the n-channel transistor 171_A and the p-channel transistor 171_B can be manufactured.

Next, part of each of the insulating films 215 and 217 is selectively etched to form opening portions. Then, contact plugs 219a to 219d are formed in the opening portions. Typically, the contact plugs 219a to 219d are formed in such a manner that after a conductive film is formed by a sputtering method, a CVD method, or the like, planarization treatment is performed by a chemical mechanical polishing (CMP) method, etching, or the like, and an unnecessary portion of the conductive film is removed.

The conductive film to be the contact plugs 219a to 219d is formed in such a manner that tungsten silicide is formed by a CVD method using a WF$_6$ gas and a SiH$_4$ gas to fill the opening portions.

Next, an insulating film is formed by a sputtering method, a CVD method, or the like over the insulating film 217 and the contact plugs 219a to 219d, and then, part of the insulating film is selectively etched to form an insulating film 221 having a groove portion. Next, after a conductive film is formed by a sputtering method, a CVD method, or the like, planarization treatment is performed by a CMP method, etching, or the like, and an unnecessary portion of the conductive film is removed; thus, wirings 223a to 223c are formed (see FIG. 11A).

The insulating film 221 can be formed using a material similar to that of the insulating film 215.

The wirings 223a to 223c are formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

The insulating film 221 and the wirings 223a to 223c which are planarized are used, whereby variation in electric characteristics of a transistor in which a channel formation region is formed in an oxide semiconductor to be formed later can be reduced. Further, the transistor in which a channel formation region is formed in an oxide semiconductor can be manufactured with a high yield.

Next, heat treatment or plasma treatment is preferably performed so that hydrogen contained in the insulating film 221 and the wirings 223a to 223c is released. Consequently, in heat treatment performed later, diffusion of hydrogen to an insulating film and an oxide semiconductor film to be formed later can be prevented. The heat treatment is performed at a temperature of higher than or equal to 100° C. and lower than the strain point of the substrate in an inert atmosphere, a reduced-pressure atmosphere, or a dry air atmosphere. Further, for the plasma treatment, a rare gas, oxygen, nitrogen, or nitrogen oxide (e.g., nitrous oxide, nitrogen monoxide, or nitrogen dioxide) is used.

Next, an insulating film 225 is formed by a sputtering method, a CVD method, or the like over the insulating film 221 and the wirings 223a to 223c. The insulating film 225 is formed with a single layer or a stack including one or more of silicon oxide, silicon oxynitride, silicon nitride oxide, gallium oxide, hafnium oxide, yttrium oxide, aluminum oxide, and aluminum oxynitride. The insulating film 225 is preferably formed using an oxide insulating film from which part of oxygen is released by heating. As the oxide insulating film from which part of oxygen is released by heating, an oxide insulating film containing oxygen at a proportion exceeding the stoichiometric proportion is used. Oxygen is released by heating from the oxide insulating film; therefore, oxygen can be diffused into the oxide semiconductor film by heating performed in a later step.

The insulating film 225 is preferably planarized by CMP treatment or the like. The CMP treatment may be performed once or plural times. When the CMP treatment is performed plural times, first polishing is preferably performed with a high polishing rate followed by final polishing with a low polishing rate. By performing polishing steps with different polishing rates in combination, the planarity of the surface of the insulating film 225 can be further increased.

Alternatively, plasma treatment can be used as the planarization treatment of the insulating film 225. The plasma treatment is performed in such a manner that an inert gas, for example, a rare gas such as an argon gas is introduced into a vacuum chamber and an electric field is applied so that a surface to be processed serves as a cathode. The plasma treatment has a principle similar to that of a plasma dry etching method and an inert gas is used in the plasma treatment. In other words, the plasma treatment is treatment in which the surface to be processed is irradiated with ions of an inert gas and minute unevenness of the surface is reduced by a sputtering effect. Therefore, the plasma treatment can also be referred to as "reverse sputtering treatment".

In the plasma treatment, electrons and argon cations are present in plasma and the argon cations are accelerated in a cathode direction. The surface to be processed is sputtered by the accelerated argon cations. At this time, a projecting portion of the surface to be processed is preferentially sputtered. Particles generated by sputtering from the surface to be processed attach to another place of the surface to be processed. At this time, the particles are preferentially attached to a depressed portion of the surface to be processed. In this manner, by reducing the projecting portion and filling the depressed portion, the planarity of the surface to be processed can be improved. Note that a combination of plasma treatment and CMP treatment can further planarize the insulating film 225.

Note that through the plasma treatment, it is possible to remove impurities such as hydrogen, moisture, and an organic substance attached onto the surface of the insulating film 225 by a sputtering effect.

It is preferable that impurities such as hydrogen, water, a hydroxyl group, and hydride in a deposition chamber be removed by heating and evacuation of the deposition chamber before formation of the oxide semiconductor. It is particularly important to remove such impurities adsorbed on an inner wall of the deposition chamber. Here, the heat treatment may be performed at a temperature of higher than or equal to 100° C. and lower than or equal to 450° C., for example. Evacuation of the deposition chamber is preferably performed with a rough vacuum pump such as a dry pump, and a high vacuum pump such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, combination of the turbo molecular pump and a cryopump having a high capability in evacuating water or a sputter ion pump having a high capability in evacuating hydrogen is effective. At this time, when the impurities are removed while an inert gas is introduced, the rate of desorption of water or the like, which is difficult to desorb only by evacuation, can be further increased. Removal of impurities in the deposition chamber by such treatment before the film formation of the oxide semiconductor can prevent hydrogen, water, a hydroxyl group, hydride, and the like from entering the oxide semiconductor.

Before the oxide semiconductor film is formed by a sputtering apparatus, a dummy substrate may be put into the sputtering apparatus, and an oxide semiconductor film may be formed over the dummy substrate, so that hydrogen and moisture attached to the target surface or a deposition shield may be removed.

Figure 11A:
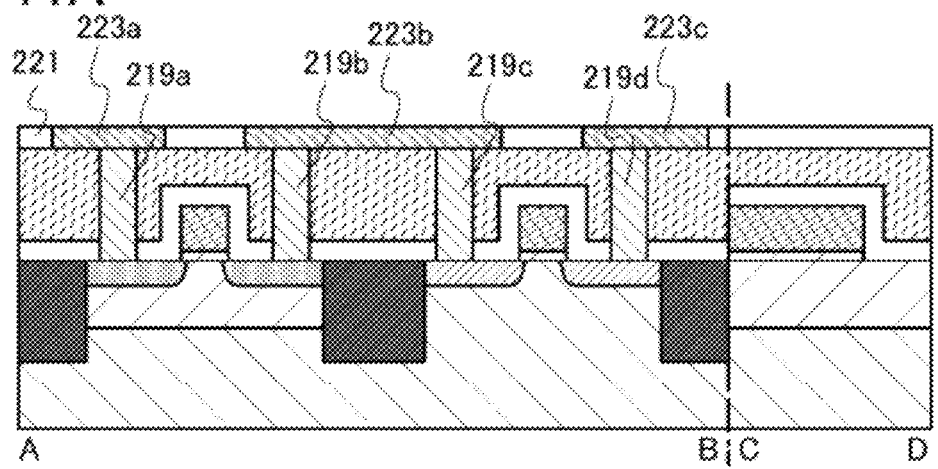
FIGS. 11A and 11B illustrate steps of manufacturing a programmable logic device.
Figure 11B:
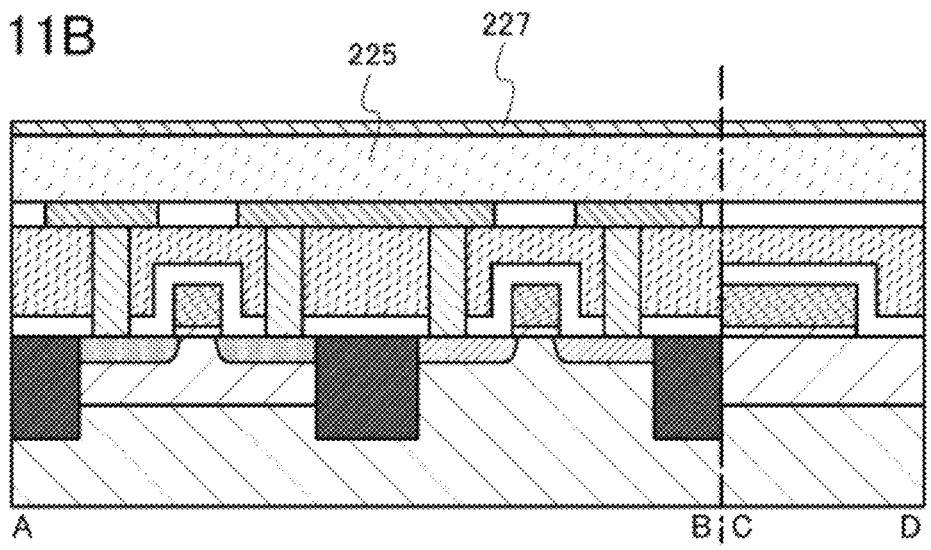

Next, an oxide semiconductor film 227 is formed over the insulating film 225 by a sputtering method, a coating method, a printing method, a pulsed laser deposition method, or the like (see FIG. 11B). Here, as the oxide semiconductor film 227, an oxide semiconductor film having a thickness of greater than or equal to 1 nm and less than or equal to 50 nm, preferably greater than or equal to 3 nm and less than or equal to 30 nm is formed by a sputtering method. When the oxide semiconductor film 227 has a thickness in the above range, a short-channel effect which might be caused due to miniaturization of the transistor can be suppressed.

An oxide semiconductor used for the oxide semiconductor film 227 preferably contains at least indium (In) or zinc (Zn). In particular, In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. Further, silicon oxide may be included in the above oxide semiconductor. Here, for example, an In—Ga—Zn-based oxide means an oxide containing indium (In), gallium (Ga), and zinc (Zn) as its main components and there is no particular limitation on the ratio of In:Ga:Zn. The In—Ga—Zn-based oxide may contain a metal element other than In, Ga, and Zn. In this case, the amount of oxygen in the oxide semiconductor preferably exceeds the stoichiometric proportion of oxygen. When the amount of oxygen exceeds the stoichiometric proportion, generation of carriers which results from oxygen vacancies in the oxide semiconductor film can be suppressed.

Alternatively, a material represented by $InMO_3(ZnO)_m$ (m>0, and m is not an integer) may be used as the oxide semiconductor. Note that M represents one or more metal elements selected from Ga, Fe, Mn, and Co. Alternatively, as the oxide semiconductor, a material represented by $In_3SnO_5(ZnO)_n$ (n>0, and n is an integer) may be used.

Note that the concentration of an alkali metal or an alkaline earth metal in the oxide semiconductor film 227 is preferably lower than or equal to $1\times10^{18}$ atoms/cm$^3$, more preferably lower than or equal to $2\times10^{16}$ atoms/cm$^3$. When an alkali metal or an alkaline earth metal is bonded to an oxide semiconductor, carriers are generated in some cases, which cause an increase in the off-state current of the transistor.

The oxide semiconductor film 227 may contain nitrogen at a concentration of lower than or equal to $5\times10^{18}$ atoms/cm$^3$.

As an oxide semiconductor which can be used for the oxide semiconductor film 227, a wide bandgap semiconductor which has a wider bandgap and lower intrinsic carrier density than silicon is used. The off-state current of a transistor can be reduced with the use of an oxide semiconductor having a wide energy gap.

The oxide semiconductor film 227 may have a single crystal structure or a non-single-crystal structure. In the latter case, the oxide semiconductor film 227 may have either an amorphous structure or a polycrystal structure. Further, the oxide semiconductor film 227 may have an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when surface flatness is improved, mobility higher than that of an oxide semiconductor in an amorphous state can be obtained. In order to improve the surface flatness, the oxide semiconductor is preferably formed over a flat surface. As described above, the average surface roughness (Ra) of the surface of the insulating film 225 is 1 nm or less, preferably 0.3 nm or less, further preferably 0.1 nm or less, and the oxide semiconductor film 227 is preferably formed thereover.

Here, the oxide semiconductor film 227 is formed by a sputtering method.

For example, as a target used in the sputtering method, the following can be given: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also represented as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

In the case where an In—Ga—Zn-based oxide material is used as an oxide semiconductor, a ratio of the metal elements of the target is In:Ga:Zn=1:1:1 (1/3:1/3:1/3) in an atomic ratio ($In_2O_3$:$Ga_2O_3$:ZnO=1:1:2 in a molar ratio), In:Ga:Zn=2:2:1 (2/5:2/5:1/5) in an atomic ratio ($In_2O_3$:$Ga_2O_3$:ZnO=1:1:1 in a molar ratio), or the like. A target of an In—Ga—Zn-based oxide having any of the above atomic ratios or an oxide whose composition is in the neighborhood of the above compositions can be used.

In the case where an In—Sn—Zn-based oxide material is used as an oxide semiconductor, a ratio of the metal elements of the target is In:Sn:Zn=1:1:1 (=1/3:1/3:1/3), 2:1:3 (=1/3:1/6:1/2), 2:1:5 (=1/4:1/8:5/8), 1:2:2 (=1/5:2/5:2/5), 20:45:35, or the like in an atomic ratio, for example. A target of an In—Sn—Zn-based oxide having any of the above atomic ratios or an oxide whose composition is in the neighborhood of the above compositions can be used.

In the case where an In—Zn-based oxide material is used as the oxide semiconductor, a ratio of the metal elements of the target is In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 in a molar ratio). For example, in a target used for formation of an In—Zn-based oxide semiconductor which has an atomic ratio of In:Zn:O=X:Y:Z, the relation of Z>1.5X+Y is satisfied. A target of an In—Zn oxide having any of the above atomic ratios or an oxide whose composition is in the neighborhood of the above compositions can be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas. Further, in order to prevent hydrogen, water, a hydroxyl group, hydride, and the like from entering the oxide semiconductor film, as a sputtering gas, it is preferable to use an atmosphere of a high-purity gas from which impurities such as hydrogen, water, a hydroxyl group, and hydride are sufficiently removed.

In a sputtering method, an RF power supply device, an AC power supply device, a DC power supply device, or the like can be used as a power supply device for generating plasma as appropriate.

The leakage rate of a treatment chamber in which the oxide semiconductor film is formed is preferably lower than or equal to $1 \times 10^{-10}$ Pa·m³/sec., whereby entry of an impurity into the film to be formed by a sputtering method can be decreased. As described above, in the process for forming the oxide semiconductor film and preferably in the process for forming the oxide insulating film, entry of impurities is suppressed as much as possible through control of the pressure of the treatment chamber, leakage rate of the treatment chamber, and the like, whereby entry of impurities including hydrogen into the oxide semiconductor film can be reduced. In addition, diffusion of impurities such as hydrogen from the oxide insulating film to the oxide semiconductor film can be reduced.

As the oxide semiconductor film 227, a c-axis aligned crystalline oxide semiconductor (CAAC-OS) film may be used.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

An example of a crystal structure of the CAAC-OS film will be described in detail with reference to FIGS. 14A to 14E, FIGS. 15A to 15C, and FIGS. 16A to 16C. In FIGS. 14A to 14E, FIGS. 15A to 15C, and FIGS. 16A to 16C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 14A to 14E, O surrounded by a circle represents tetracoordinate O and O surrounded by a double circle represents tricoordinate O.

Figure 14A:
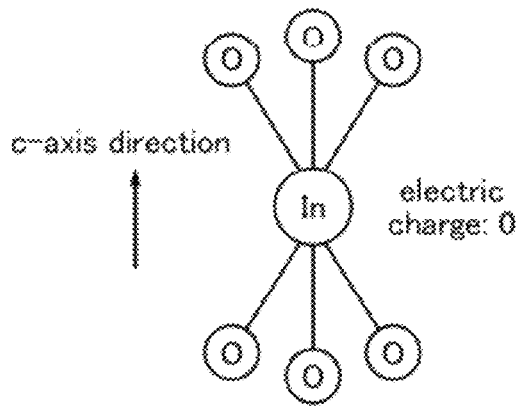
FIGS. 14A to 14E each illustrate a structure of an oxide material according to an embodiment of the present invention.

FIG. 14A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 14A is actually an octahedral structure, but is illustrated as a planar structure for simplicity. Note that three tetracoordinate O atoms exist in each of an upper half and a lower half in FIG. 14A. In the small group illustrated in FIG. 14A, electric charge is 0.

Figure 14D:
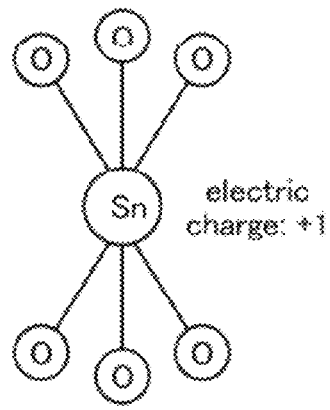
Figure 14B:
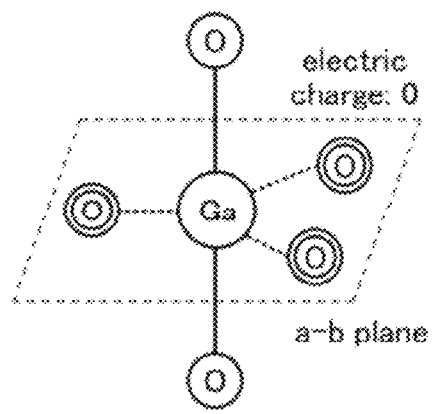

FIG. 14B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 14B. An In atom can also have the structure illustrated in FIG. 14B because an In atom can have five ligands. In the small group illustrated in FIG. 14B, electric charge is 0.

Figure 14E:
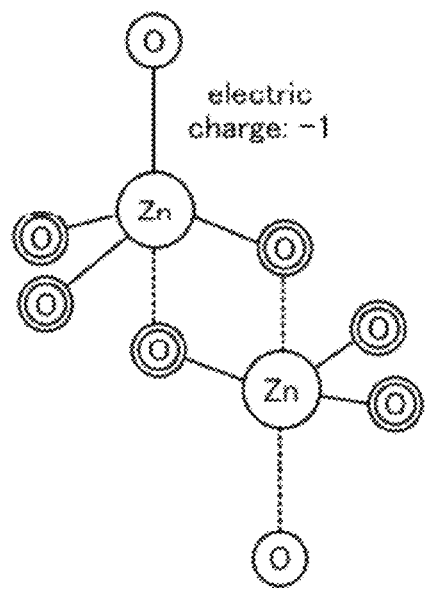
Figure 14C:
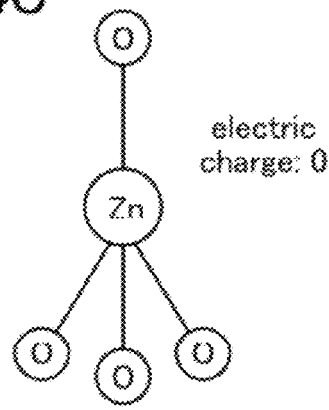

FIG. 14C illustrates a structure including one tetracoordinate Zn atom and four tetracoordinate O atoms proximate to the Zn atom. In FIG. 14C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 14C. In the small group illustrated in FIG. 14C, electric charge is 0.

FIG. 14D illustrates a structure including one hexacoordinate Sn atom and six tetracoordinate O atoms proximate to the Sn atom. In FIG. 14D, three tetracoordinate O atoms exist in each of an upper half and a lower half. In the small group illustrated in FIG. 14D, electric charge is +1.

FIG. 14E illustrates a small group including two Zn atoms. In FIG. 14E, one tetracoordinate O atom exists in each of an upper half and a lower half. In the small group illustrated in FIG. 14E, electric charge is −1.

Here, a plurality of small groups forms a medium group, and a plurality of medium groups forms a large group (also referred to as a unit cell).

Now, a rule of bonding between the small groups will be described. The three O atoms in the upper half with respect to the hexacoordinate In atom in FIG. 14A each have three proximate In atoms in the downward direction, and the three O atoms in the lower half each have three proximate In atoms in the upward direction. The one O atom in the upper half with respect to the pentacoordinate Ga atom in FIG. 14B has one proximate Ga atom in the downward direction, and the one O atom in the lower half has one proximate Ga atom in the upward direction. The one O atom in the upper half with respect to the tetracoordinate Zn atom in FIG. 14C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 15A:
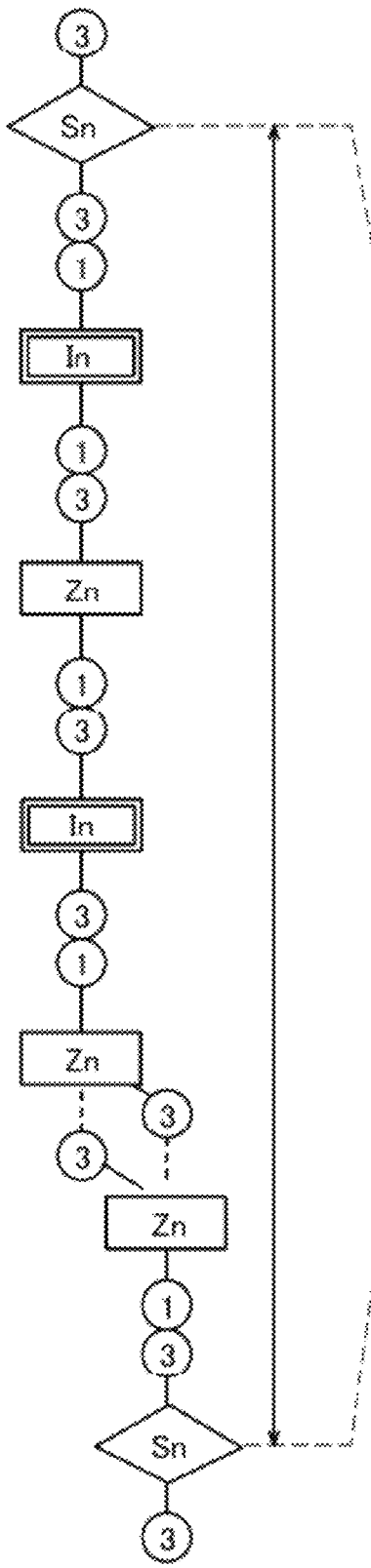
FIGS. 15A to 15C illustrate a structure of an oxide material according to an embodiment of the present invention.
Figure 15B:
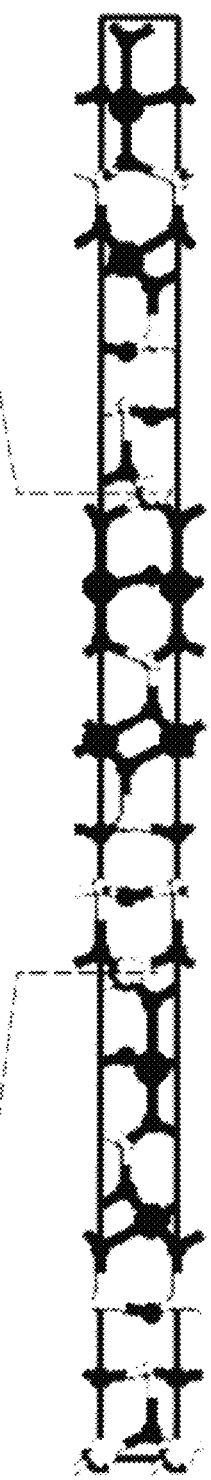
Figure 15C:

FIG. 15A illustrates a model of a medium group included in a layered structure of an In—Sn—Zn-based oxide. FIG. 15B illustrates a large group including three medium groups. Note that FIG. 15C illustrates an atomic arrangement in the case where the layered structure in FIG. 15B is observed from the c-axis direction.

In FIG. 15A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 15A, one tetracoordinate O atom existing in each of an upper half and a lower half with respect to an In atom is denoted by circled 1. FIG. 15A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 15A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively.

Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 14E can be given. For example, with one small group including two Zn atoms, electric charge of one small group including a Sn atom can be cancelled, so that the total electric charge of the layered structure can be 0.

When the large group illustrated in FIG. 15B is repeated, an In—Sn—Zn-based oxide crystal ($In_2SnZn_3O_8$) can be obtained. Note that a layered structure of the obtained In—Sn—Zn-based oxide crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 16A:
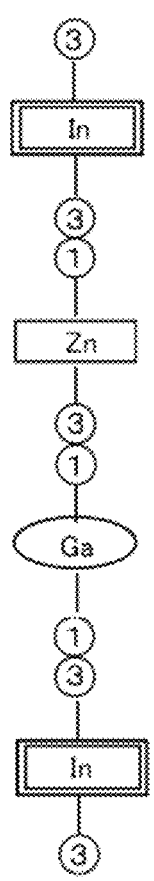
FIGS. 16A to 16C illustrate a structure of an oxide material according to an embodiment of the present invention.

As an example, FIG. 16A illustrates a model of a medium group included in a layered structure of an In—Ga—Zn-based oxide.

In the medium group included in the layered structure of the In—Ga—Zn-based oxide in FIG. 16A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 16B:
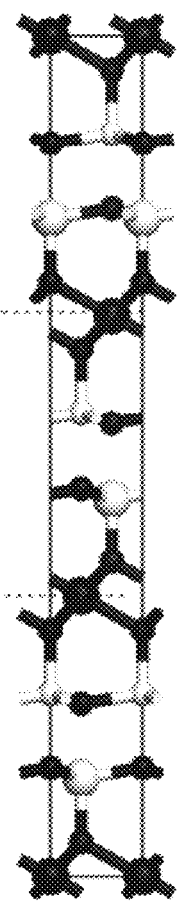
Figure 16C:
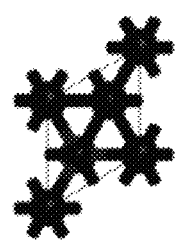

FIG. 16B illustrates a large group including three medium groups. Note that FIG. 16C illustrates an atomic arrangement in the case where the layered structure in FIG. 16B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 16A but also a medium group in which the arrangement of the In atom, the Ga atom, and the Zn atom is different from that in FIG. 16A.

The substrate is heated to a temperature higher than 200° C. and lower than or equal to 700° C., preferably higher than 300° C. and lower than or equal to 500° C., more preferably higher than or equal to 400° C. and lower than or equal to 450° C. during the formation of the oxide semiconductor film 227 so that the oxide semiconductor film 227 includes the CAAC-OS. The oxide semiconductor film 227 is formed while the substrate is heated in this manner, whereby the oxide semiconductor film 227 can be the CAAC-OS film.

Alternatively, a first oxide semiconductor film having a thickness of greater than or equal to a thickness of one atomic layer and less than or equal to 10 nm, preferably greater than or equal to 2 nm and less than or equal to 5 nm, which is thin, is formed while the heating is performed at temperature in the above range, and then a second oxide semiconductor film which is thick is formed while heating is performed in a similar manner; thus, the first oxide semiconductor film and the second oxide semiconductor film may be stacked to form the oxide semiconductor film 227 which is the CAAC-OS film.

In order to form an oxide semiconductor film 227 having an amorphous structure, the substrate is not heated or the substrate is heated so that the substrate temperature is lower than 200° C., preferably lower than 180° C. in the formation of the oxide semiconductor film 227. The oxide semiconductor film 227 is formed in this manner, whereby the oxide semiconductor film 227 can have an amorphous structure.

Alternatively, the oxide semiconductor film 227 which is the CAAC-OS film may be formed in the following manner: after an oxide semiconductor film having an amorphous structure is formed in the above manner, heat treatment at a temperature of higher than or equal to 250° C. and lower than or equal to 700° C., preferably higher than or equal to 400° C., more preferably higher than or equal to 500° C., still more preferably higher than or equal to 550° C. is performed, so that at least part of the oxide semiconductor film having an amorphous structure is crystallized. Note that the heat treatment can be performed in an inert gas atmosphere. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is lower than or equal to 1 ppm, preferably lower than or equal to 0.1 ppm). Heat treatment for hydration or hydrogenation, which is described later, can serve as this heat treatment.

After the oxide semiconductor film 227 is formed, the oxide semiconductor film 227 may be subjected to heat treatment (first heat treatment). The heat treatment can further remove a substance including a hydrogen atom in the oxide semiconductor film 227; thus, a structure of the oxide semiconductor film 227 can be improved and defect levels in the energy gap can be reduced. The heat treatment is performed in an inert gas atmosphere at a temperature of higher than or equal to 300° C. and lower than or equal to 700° C., preferably higher than or equal to 450° C. and lower than or equal to 600° C. In the case where the substrate has the strain point, the heat treatment is performed at a temperature lower than the strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is lower than or equal to 1 ppm, preferably lower than or equal to 0.1 ppm).

The heat treatment can be performed in such a way that, for example, the semiconductor substrate 201 is introduced into an electric furnace using a resistance heating element or the like and heated at 450° C. under a nitrogen atmosphere for an hour.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used. Note that in the case where a GRTA apparatus is used as the heat treatment apparatus, the substrate may be heated in an inert gas heated to high temperature of 650° C. to 700° C. because the heat treatment time is short.

In addition, after the oxide semiconductor film 227 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace. It is preferable that water, hydrogen, and the like be not contained in these gases in particular. The purity of the oxygen gas or the $N_2O$ gas that is introduced into the same furnace is preferably 6N or higher, further preferably 7N or higher (i.e., the concentration of impurities in the oxygen gas or the $N_2O$ gas is 1 ppm or lower, preferably 0.1 ppm or lower). By the action of the oxygen gas or the $N_2O$ gas, oxygen which is one of main components of the oxide semiconductor and which has been eliminated at the same time as the step for removing impurities by dehydration or dehydrogenation can be supplied.

Note that the heat treatment can be referred to as dehydration treatment, dehydrogenation treatment, or the like because of its advantageous effect of removing hydrogen, water, or the like. The heat treatment can be performed at the timing, for example, before the oxide semiconductor layer is processed to have an island shape, after the gate insulating film is formed, or the like. Such heat treatment for dehydration or dehydrogenation may be performed once or plural times.

Next, part of the oxide semiconductor film 227 is selectively etched to form an oxide semiconductor film 229. Then, an insulating film 231 is formed over the oxide semiconductor film 229 by a sputtering method, a CVD method, or the like. After that, a gate electrode 233 is formed over the insulating film 231 (see FIG. 12A).

The insulating film 231 may be formed with a single layer or a stack using one or more of silicon oxide, silicon oxynitride, silicon nitride oxide, silicon nitride, aluminum oxide, hafnium oxide, gallium oxide, a Ga—Zn-based oxide, and the like. The insulating film 231 may also be an oxide insulating film from which oxygen is released by heating, such as a film that can be used as the insulating film 225. By using a film from which oxygen is released by heating as the insulating film 231, oxygen vacancies caused in the oxide semiconductor film 229 can be reduced by heat treatment performed later and deterioration of electric characteristics of the transistor can be suppressed.

When the insulating film 231 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be decreased even when the thickness of the gate insulating film is reduced.

The thickness of the insulating film 231 is preferably greater than or equal to 10 nm and less than or equal to 300 nm, more preferably greater than or equal to 5 nm and less than or equal to 50 nm, still more preferably greater than or equal to 10 nm and less than or equal to 30 nm.

The gate electrode 233 can be formed using a metal element selected from aluminum, chromium, copper, tantalum, titanium, molybdenum, and tungsten; an alloy containing any of these metal elements as a component; an alloy containing these metal elements in combination; or the like. Further, one or both metal elements of manganese and zirconium may be used. Further, the gate electrode 233 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using the above light-transmitting conductive material and the above metal element.

The gate electrode 233 is formed by a printing method or an inkjet method. Alternatively, the gate electrode 233 is formed in such a manner that a conductive film is formed by a sputtering method, a CVD method, an evaporation method, or the like and then part of the conductive film is selectively etched.

As a material layer in contact with the insulating film 231, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the gate electrode 233 and the insulating film 231. These films each have a work function of higher than or equal to 5 eV, preferably higher than or equal to 5.5 eV; thus, the threshold voltage in the electric characteristics of the transistor can be positive. Accordingly, a so-called normally-off switching element can be obtained. For example, in the case of using an In—Ga—Zn—O film containing nitrogen, an In—Ga—Zn—O film having at least a higher nitrogen concentration than the oxide semiconductor film 229, specifically, an In—Ga—Zn—O film having a nitrogen concentration of higher than or equal to 7 at. % is used.

Heat treatment is preferably performed after that. Through this heat treatment, oxygen can be diffused from the insulating film 225 and the insulating film 231 to the oxide semiconductor film 229 to repair the oxygen defects included in the oxide semiconductor film 229; thus, the oxygen defects can be reduced.

Note that after the insulating film 231 is formed, heat treatment (second heat treatment) may be performed in an inert gas atmosphere or an oxygen atmosphere. The heat treatment temperature is preferably higher than or equal to 200° C. and lower than or equal to 450° C., more preferably higher than or equal to 250° C. and lower than or equal to 350° C. By performing such heat treatment, variation in electrical characteristics of the transistor can be reduced. In the case where oxygen is contained in the insulating film 231 or the insulating film 225 which is in contact with the oxide semiconductor film 229, oxygen can be supplied to the oxide semiconductor film 229 and the oxygen defects in the oxide semiconductor film 229 can be repaired. As described above, the heat treatment has an effect of supplying oxygen; therefore, the heat treatment can also be referred to as supply of oxygen.

Note that in this embodiment, the heat treatment for supply of oxygen is performed after the insulating film 231 is formed; however, the timing of the heat treatment for supply of oxygen is not limited thereto and the heat treatment may be performed after formation of the insulating film 231 as appropriate.

As described above, the heat treatment for dehydration or dehydrogenation and the heat treatment for supply of oxygen are performed to reduce impurities and fill oxygen vacancies in the oxide semiconductor film 229, whereby the oxide semiconductor film 229 can be highly purified so as to contain impurity elements that are not main components of the oxide semiconductor film 229 as little as possible.

Figure 12A:
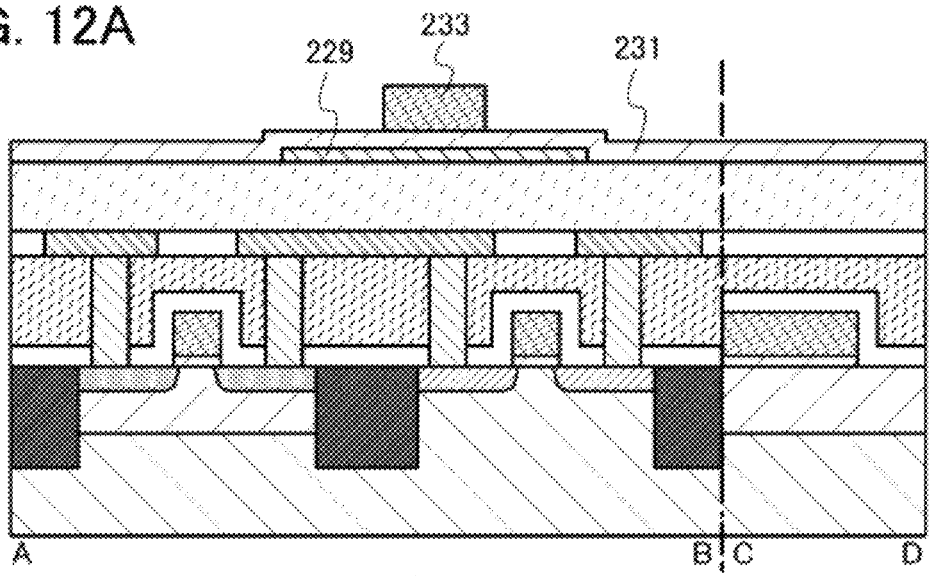
FIGS. 12A to 12C illustrate steps of manufacturing a programmable logic device.
Figure 12B:
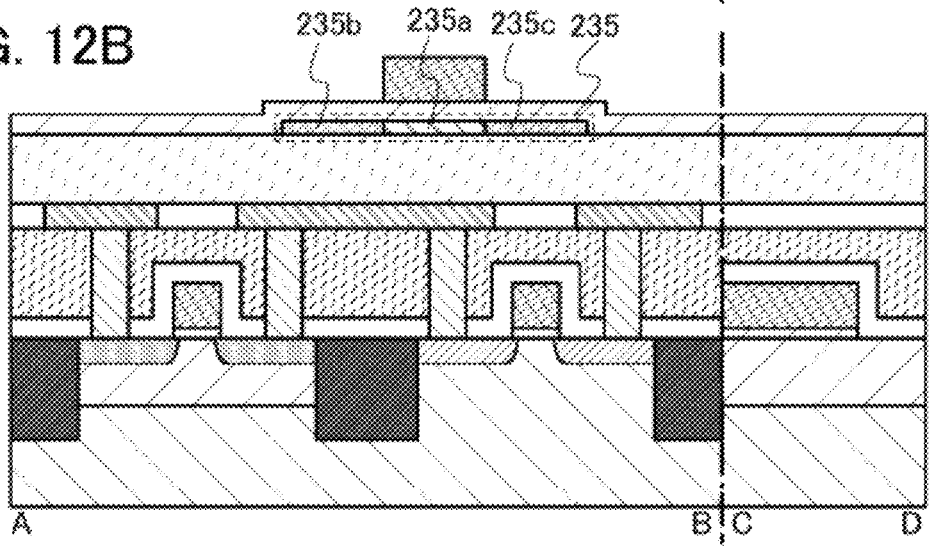

Next, treatment for adding a dopant to the oxide semiconductor film 229 is performed with the use of the gate electrode 233 as a mask. As a result, as illustrated in FIG. 12B, a first region 235a which is covered with the gate electrode 233 and to which the dopant is not added and a pair of second regions 235b and 235c containing the dopant are formed. Since the dopant is added with the use of the gate electrode 233 as a mask, the first region 235a to which the dopant is not added and the pair of second regions 235b and 235c containing the dopant can be formed in a self-aligned manner. The first region 235a which overlaps with the gate electrode 233 serves as a channel region. The pair of second regions 235b and 235c containing the dopant serves as electric-field relaxation regions. The first region 235a and the pair of second regions 235b and 235c containing the dopant constitute an oxide semiconductor film 235.

The concentration of hydrogen in the first region 235a of the oxide semiconductor film 235 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, still more preferably lower than or equal to $1\times10^{16}$ atoms/cm$^3$. By a bond of an oxide semiconductor and hydrogen, part of contained hydrogen serves as a donor to generate electrons as carriers. For that reason, by reduction in the concentration of hydrogen in the first region 235a of the oxide semiconductor film 235, a negative shift of the threshold voltage can be reduced.

The concentration of the dopant in the pair of second regions 235b and 235c is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Since the pair of second regions 235b and 235c contains the dopant, the carrier density or the number of defects can be increased. Therefore, the conductivity can be higher than that of the first region 235a which does not contain the dopant. Note that an excessive increase in the concentration of the dopant causes inhibition of carrier movement by the dopant, which leads to a reduction in conductivity of the pair of second regions 235b and 235c containing the dopant.

The pair of second regions 235b and 235c containing the dopant preferably has a conductivity of higher than or equal to 0.1 S/cm and lower than or equal to 1000 S/cm, preferably higher than or equal to 10 S/cm and lower than or equal to 1000 S/cm.

The existence of the pair of second regions 235b and 235c containing the dopant in the oxide semiconductor film 235 can relieve an electric field applied to the end portion of the first region 235a serving as a channel region. Thus, a short-channel effect of the transistor can be suppressed.

As a method for adding the dopant to the oxide semiconductor film 229, an ion doping method or an ion implantation method can be used. As the dopant, at least one of boron, nitrogen, phosphorus, and arsenic can be added. Alternatively, as the dopant, at least one of helium, neon, argon, krypton, and xenon can be added. Further alternatively, hydrogen may be added as the dopant. Still alternatively, as the dopant, at least one of boron, nitrogen, phosphorus, and arsenic, at least one of helium, neon, argon, krypton, and xenon, and hydrogen in appropriate combination can be added.

The addition of the dopant to the oxide semiconductor film 229 is conducted in a state where the oxide semiconductor film 229 is covered with the insulating film and the like; alternatively, the addition of the dopant may be conducted in a state where the oxide semiconductor film 229 is exposed.

Alternatively, the dopant can be added by a method other than an ion doping method, an ion implantation method, or the like. For example, the dopant can be added in the following manner plasma is generated in an atmosphere of a gas containing an element to be added and plasma treatment is performed on an object to which the dopant is added. A dry etching apparatus, a CVD apparatus, a high-density CVD apparatus, or the like can be used to generate the plasma.

After that, heat treatment may be performed. The heat treatment is performed typically at a temperature of higher than or equal to 150° C. and lower than or equal to 450° C., preferably higher than or equal to 250° C. and lower than or equal to 325° C. In the heat treatment, the temperature may be gradually increased from 250° C. to 325° C.

Through the heat treatment, the resistance of the pair of second regions 235b and 235c containing the dopant can be reduced. In the heat treatment, the pair of second regions 235b and 235c containing the dopant may be in either a crystalline state or an amorphous state.

Figure 12C:
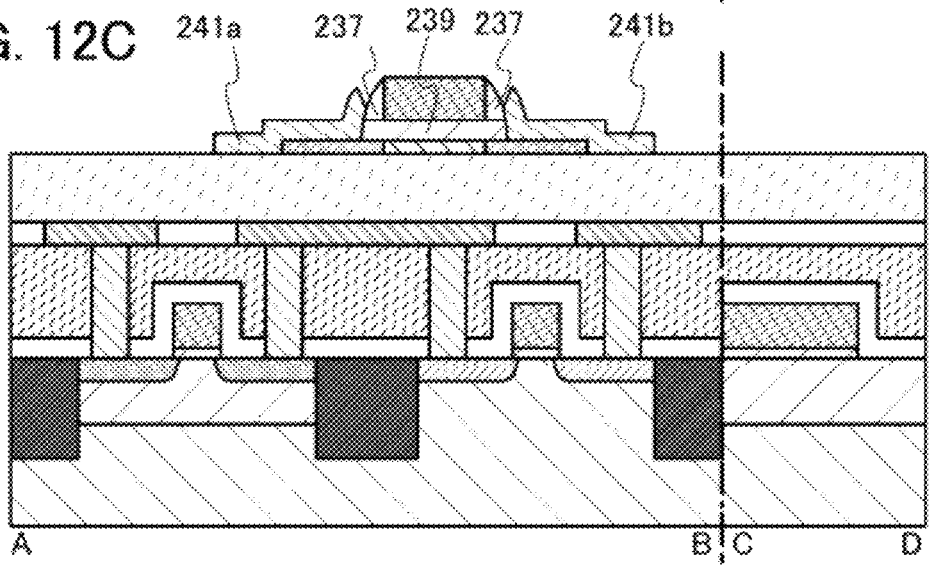

Next, as illustrated in FIG. 12C, sidewall insulating films 237 on side surfaces of the gate electrode 233, a gate insulating film 239, an electrode 241a, and an electrode 241b are formed.

The sidewall insulating films 237 may each be formed with a single layer or a stack using one or more of silicon oxide, silicon oxynitride, silicon nitride oxide, silicon nitride, aluminum oxide, aluminum oxynitride, aluminum nitride oxide, aluminum nitride, and the like, for example. The sidewall insulating films 237 may be formed using an oxide insulating film from which part of oxygen is released by heating in a manner similar to that of the insulating film 225.

A method for forming the sidewall insulating films 237 is described below.

First, an insulating film to be the sidewall insulating films 237 is formed over the insulating film 231 and the gate electrode 233. The insulating film is formed by a sputtering method, a CVD method, or the like. In addition, although the thickness of the insulating film is not particularly limited, the thickness is selected as appropriate in consideration of coverage with respect to the shape of the gate electrode 233.

Then, the sidewall insulating films 237 are formed by etching the insulating film. The etching here is highly anisotropic etching, and the sidewall insulating films 237 can be formed in a self-aligned manner by performing the highly anisotropic etching on the insulating film.

The width of the region for relieving an electric field in each of the pair of second regions 235b and 235c containing the dopant depends on the width of the sidewall insulating films 237, and the width of the sidewall insulating films 237 depends on the thickness of the gate electrode 233. Therefore, the thickness of the gate electrode 233 may be determined so that the width of the region for relieving an electric field has a desired value.

When the sidewall insulating films 237 are formed, the insulating film 231 is also etched by highly anisotropic etching and the oxide semiconductor film 229 is partly exposed, whereby the gate insulating film 239 is formed.

The pair of electrodes 241a and 241b can be formed using a material similar to that of the wirings 223a to 223c, as appropriate. Note that the pair of electrodes 241a and 241b may function as wirings.

The pair of electrodes 241a and 241b is formed by a printing method or an inkjet method. Alternatively, the pair of electrodes 241a and 241b is formed in such a manner that a conductive film is formed by a sputtering method, a CVD method, an evaporation method, or the like and then part of the conductive film is selectively etched.

The pair of electrodes 241a and 241b is preferably formed to be in contact with side surfaces of the sidewall insulating films 237 and the gate insulating film 239. In other words, it is preferable that end portions of the pair of electrodes 241a and 241b of the transistor be located over the sidewall insulating films 237 and that the pair of electrodes 241a and 241b entirely cover exposed portions of the pair of second regions 235b and 235c containing the dopant in the oxide semiconductor film 235. As a result, regions in the pair of second regions 235b and 235c containing the dopant, which are in contact with the pair of electrodes 241a and 241b, serve as a source region and a drain region, whereas regions in the pair of second regions 235b and 235c containing the dopant, which overlap with both the gate insulating film 239 and one of the sidewall insulating films 237, serve as electric-field relaxation regions. In addition, since the width of the electric-field relaxation regions can be controlled with the length of the sidewall insulating films 237, a high accuracy in alignment of a mask for forming the pair of electrodes 241a and 241b is not strictly required. Accordingly, variation among plural transistors can be reduced.

Note that the sidewall insulating films 237 are provided in contact with the side surfaces of the gate electrode 233 in this embodiment; however, the present invention is not limited to this structure, and the sidewall insulating films 237 are not necessarily provided. Although the sidewall insulating films 237 are formed after the pair of second regions 235b and 235c is formed in this embodiment, the present invention is not limited to this structure and the pair of second regions 235b and 235c may be formed after the sidewall insulating films 237 are formed. With such a structure, the first region 235a can be extended to partly overlap with the sidewall insulating films 237.

Figure 13A:
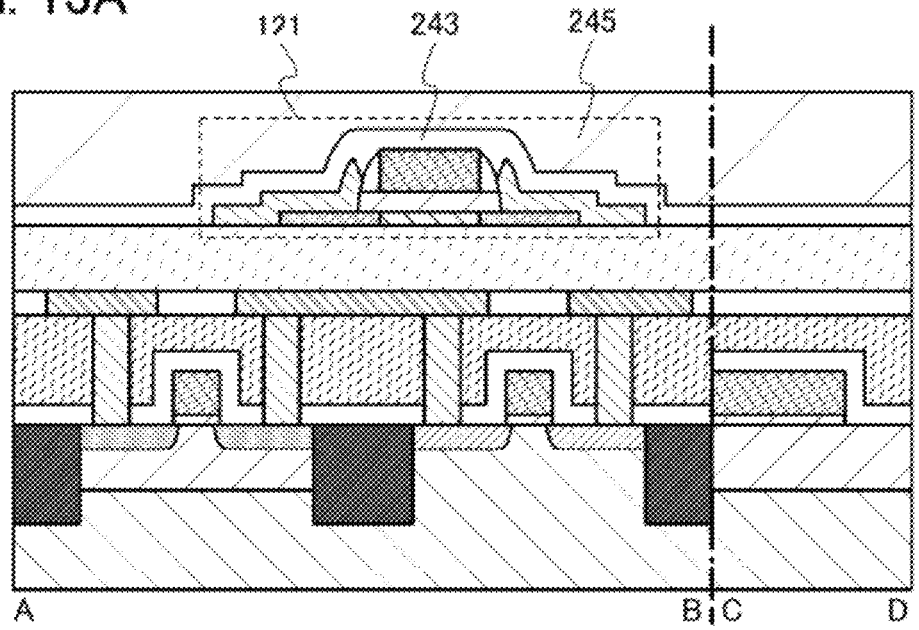
FIGS. 13A and 13B illustrate steps of manufacturing a programmable logic device.
Figure 13B:
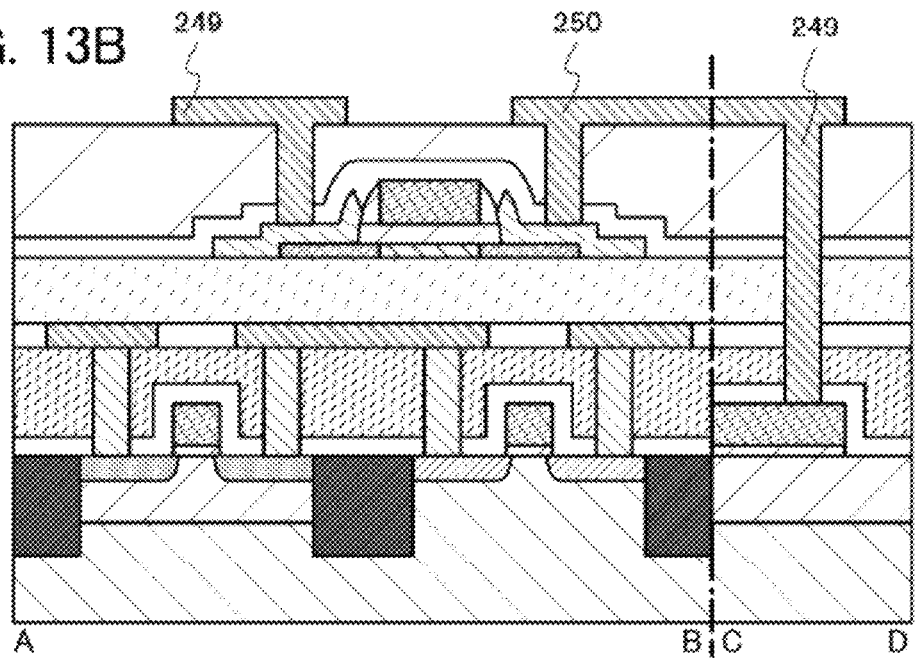

Next, as illustrated in FIG. 13A, an insulating film 243 and an insulating film 245 are formed by a sputtering method, a CVD method, a coating method, a printing method, or the like.

The insulating films 243 and 245 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 245 is formed using an insulating film which prevents diffusion of oxygen to the outside, oxygen released from the insulating film 243 can be supplied to the oxide semiconductor film. Typical examples of the insulating film which prevents diffusion of oxygen to the outside include films of aluminum oxide, aluminum oxynitride, and the like. When an insulating film which prevents diffusion of hydrogen from the outside is used as the insulating film 245, diffusion of hydrogen from the outside to the oxide semiconductor film can be reduced, and defects in the oxide semiconductor film can be reduced. Typical examples of the insulating film which prevents diffusion of hydrogen from the outside include films of silicon nitride, silicon nitride oxide, aluminum nitride, aluminum nitride oxide, and the like. Further, when the insulating film 243 has a three-layer structure of an oxide insulating film from which part of oxygen is released by heating, an insulating film which prevents diffusion of oxygen to the outside, and an oxide insulating film, oxygen can be efficiently diffused to the oxide semiconductor film and oxygen can be prevented from being released to the outside; accordingly, variation in transistor characteristics can be reduced even at high temperature and in high humidity.

Through the above steps, as illustrated in FIG. 13A, the transistor 121 in which a channel formation region is formed in an oxide semiconductor can be formed. Note that the transistor 121 includes the oxide semiconductor film 235 including an i-type (intrinsic) or substantially i-type region 235a, and therefore exhibits excellent characteristics.

Although the transistor 121 of this embodiment has a top-gate structure, the present invention is not limited to the top-gate structure and a bottom-gate structure may be employed. Further, in the transistor 121 of this embodiment, the pair of electrodes 241a and 241b is in contact with at least part of upper surfaces of the pair of second regions 235b and 235c; however, the present invention is not limited to this structure, and the pair of second regions 235b and 235c may be in contact with at least part of the pair of electrodes 241a and 241b, for example.

Next, part of each of the insulating film 215, the insulating film 217, the insulating film 221, the insulating film 225, the insulating film 243, and the insulating film 245 is selectively etched, so that opening portions are formed to expose part of each of the gate electrode 209a, the electrode 241a, and the electrode 241b. After a conductive film is formed in the opening portions, part of the conductive film is selectively etched; thus, a wiring 249 in contact with the electrode 241a and a wiring 250 in contact with the electrode 241b are formed. The wiring 249 and the wiring 250 can be formed using the same material as that of the contact plugs 219a to 219d as appropriate.

Through the above steps, the transistor 121, the transistor 171_A, and the transistor 171_B can be formed.

As described above, a transistor in a memory circuit includes a wide bandgap semiconductor such as an oxide semiconductor, which allows a sufficient reduction in off-state current of the transistor 121, whereby configuration data can be held even while power supply voltage is not supplied.

The structures, the methods, and the like in this embodiment can combined with each other, or can also be combined with any of structures, methods, and the like in the other embodiments as appropriate.

Embodiment 3

In this embodiment, the field-effect mobility of the above-described transistor in which a channel formation region is formed in an oxide semiconductor is theoretically calculated, and the transistor characteristics are calculated from the field-effect mobility.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed by the following formula (2).

[Formula 2]

$$\mu = \mu_0 \exp\left(-\frac{E}{kT}\right) \quad (2)$$

Here, E represents the height of the potential barrier, k represents the Boltzmann constant, and T represents the absolute temperature. When the potential barrier is assumed to be attributed to a defect, the height of the potential barrier can be expressed as the following formula (3) according to the Levinson model.

[Formula 3]

$$E = \frac{e^2 N^2}{8\varepsilon n} = \frac{e^3 N^2 t}{8\varepsilon C_{ox} V_g} \quad (3)$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula (4).

[Formula 4]

$$I_d = \frac{W \mu V_g V_d C_{ox}}{L} \exp\left(-\frac{E}{kT}\right) \quad (4)$$

Here, L represents the channel length and W represents the channel width, and L and W are each 10 μm in this case. In addition, $V_d$ represents the drain voltage. When dividing both sides of the formula (4) by $V_g$ and then taking logarithms of both sides, the following formula (5) can be obtained.

[Formula 5]

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad (5)$$

The right side of the formula (5) is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like $\mu_0$ can be calculated to be 120 cm$^2$/Vs from the formula (2) and the formula (3). The measured mobility of an In—Sn—Zn oxide including a defect is approximately 40 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulator affects the transport property of the transistor. In other words, the mobility $\mu_1$ at a position that is distance x away from the interface between the channel and the gate insulator can be expressed as the following formula (6).

[Formula 6]

$$\frac{1}{\mu_1} = \frac{1}{\mu_0} + \frac{D}{B} \exp\left(-\frac{x}{G}\right) \quad (6)$$

Here, D represents the electric field in the gate direction, and B and/are constants. B and/can be obtained from actual measurement results; according to the above measurement results, B is $4.75 \times 10^7$ cm/s and/is 10 nm (the depth to which the influence of interface scattering reaches). When D is increased (i.e., when the gate voltage is increased), the second term of the formula (6) is increased and accordingly the mobility $\mu_1$ is decreased.

Figure 17:
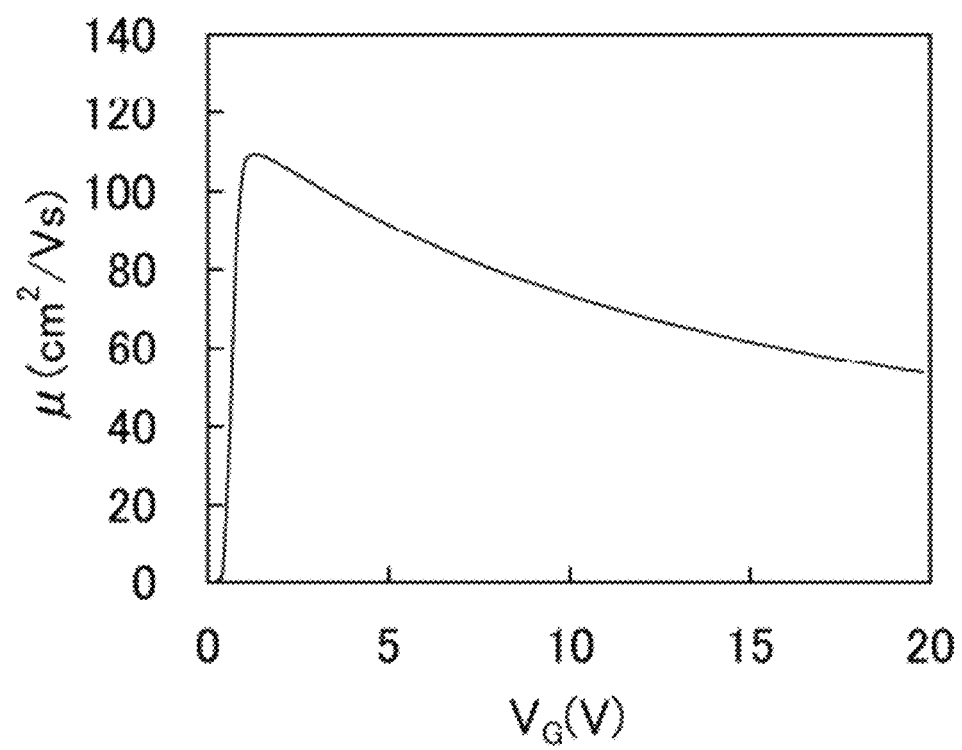
FIG. 17 is a graph showing gate voltage dependence of mobility obtained by calculation.

FIG. 17 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulator was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 17, the mobility has a peak of 100 cm$^2$/Vs or more at a gate voltage that is a little over 1 V, and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors formed using an oxide semiconductor having such a mobility are shown in FIGS. 18A to 18C, FIGS. 19A to 19C, and FIGS. 20A to 20C. FIGS. 21A and 21B illustrate cross-sectional structures of the transistors used for the calculation. The transistors illustrated in FIGS. 21A and 21B each include a second region 1103b and a second region 1103c that have n+-type conductivity in an oxide semiconductor layer. The resistivity of the second regions 1103b and 1103c is $2\times10^{-3}$ Ωcm.

The transistor in FIG. 21A is formed over a base insulating film 1101 and an embedded insulator 1102 that is embedded in the base insulating film 1101 and formed of aluminum oxide. The transistor includes the second region 1103b, the second region 1103c, an intrinsic first region 1103a that is placed between the second regions 1103b and 1103c and serves as a channel formation region, and a gate electrode 1105. The width of the gate electrode 1105 is 33 nm.

A gate insulating film 1104 is formed between the gate electrode 1105 and the first region 1103a. A sidewall insulating film 1106a and a sidewall insulating film 1106b are formed on side surfaces of the gate electrode 1105, and an insulator 1107 is formed over the gate electrode 1105 so as to prevent a short circuit between the gate electrode 1105 and another wiring. The sidewall insulating films each have a width of 5 nm. A source electrode 1108a and a drain electrode 1108b are provided in contact with the second region 1103b and the second region 1103c, respectively. Note that the channel width of this transistor is 40 nm.

The transistor in FIG. 21B is the same as the transistor in FIG. 21A in that it is formed over the base insulating film 1101 and the embedded insulator 1102 formed of aluminum oxide and that it includes the second region 1103b, the second region 1103c, the intrinsic first region 1103a provided therebetween, the gate electrode 1105 having a width of 33 nm, the gate insulating film 1104, the sidewall insulating film 1106a, the sidewall insulating film 1106b, the insulator 1107, the source electrode 1108a, and the drain electrode 1108b.

The difference between the transistor in FIG. 21A and the transistor in FIG. 21B is the conductivity type of semiconductor regions under the sidewall insulating films 1106a and 1106b. In the transistor in FIG. 21A, the semiconductor regions under the sidewall insulating films 1106a and 1106b are part of the second region 1103b having n+-type conductivity and part of the second region 1103c having n+-type conductivity, whereas in the transistor in FIG. 21B, the semiconductor regions under the sidewall insulating films 1106a and 1106b are part of the intrinsic first region 1103a. In other words, in the semiconductor layer of FIG. 21B, a region which overlaps with neither the second region 1103b (the second region 1103c) nor the gate electrode 1105 is provided. This region is called an offset region and has a width Loff called an offset length. As is seen from the drawing, the offset length is equal to the width of the sidewall insulating film 1106a (the sidewall insulating film 1106b).

Figure 18A:
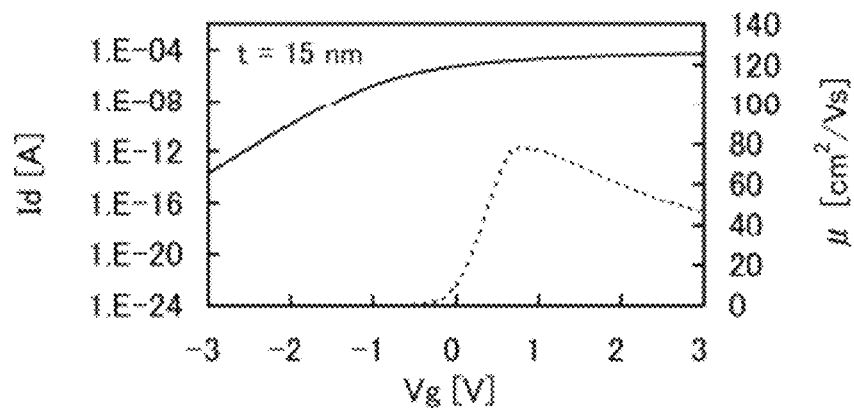
FIGS. 18A to 18C are graphs showing gate voltage dependence of drain current and mobility obtained by calculation.
Figure 18B:
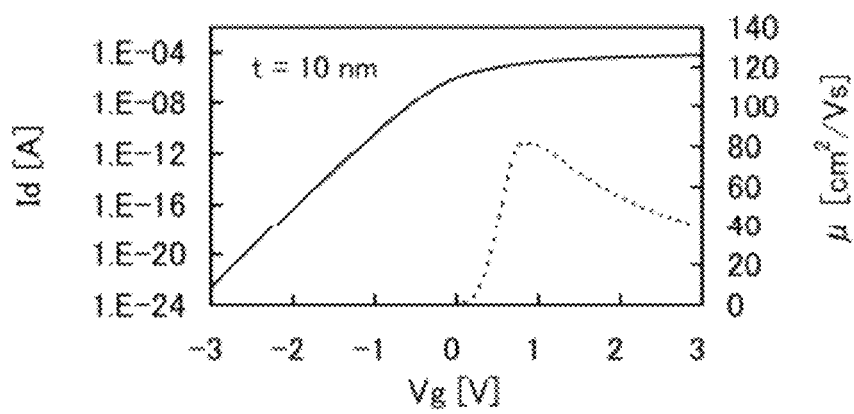
Figure 18C:
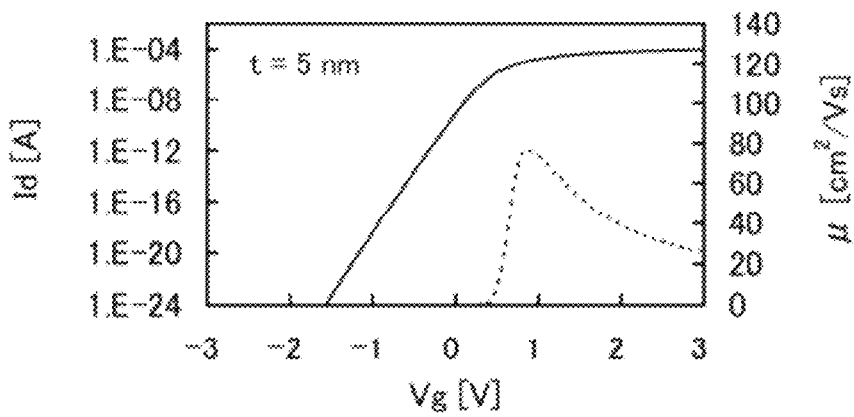

The other parameters used in calculation are as described above. For the calculation, device simulation software Sentaurus Device manufactured by Synopsys, Inc. was used. FIGS. 18A to 18C show the gate voltage ($V_g$: a potential difference between the gate and the source) dependence of the drain current ($I_d$, a solid line) and the mobility (μ, a dotted line) of the transistor having the structure illustrated in FIG. 21A. The drain current $I_d$ is obtained by calculation under the assumption that the drain voltage (a potential difference between the drain and the source) is +1 V, and the mobility μ is obtained by calculation under the assumption that the drain voltage is +0.1 V.

FIG. 18A shows the gate voltage dependence of the transistor in the case where the thickness of the gate insulating film is 15 nm, FIG. 18B shows that of the transistor in the case where the thickness of the gate insulating film is 10 nm, and FIG. 18C shows that of the transistor in the case where the thickness of the gate insulating film is 5 nm. As the gate insulating film is thinner, the drain current $I_d$ in an off state (the off-state current) in particular is significantly decreased. In contrast, there is no noticeable change in peak value of the mobility μ and the drain current $I_d$ in an on state (the on-state current). The graphs show that the drain current exceeds 10 μA, which is required in a memory element and the like, at a gate voltage of around 1 V.

Figure 19A:
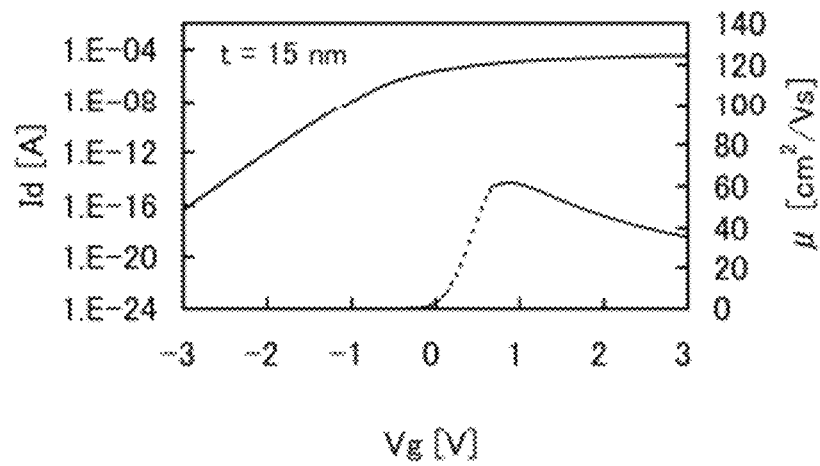
FIGS. 19A to 19C are graphs showing gate voltage dependence of drain current and mobility obtained by calculation.
Figure 19B:
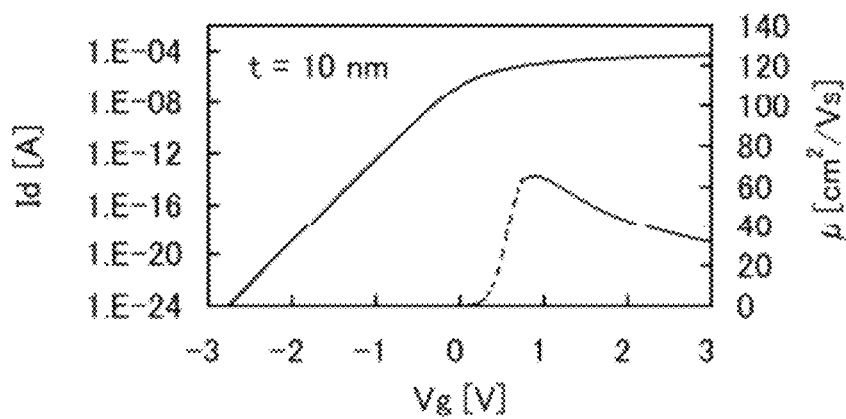
Figure 19C:
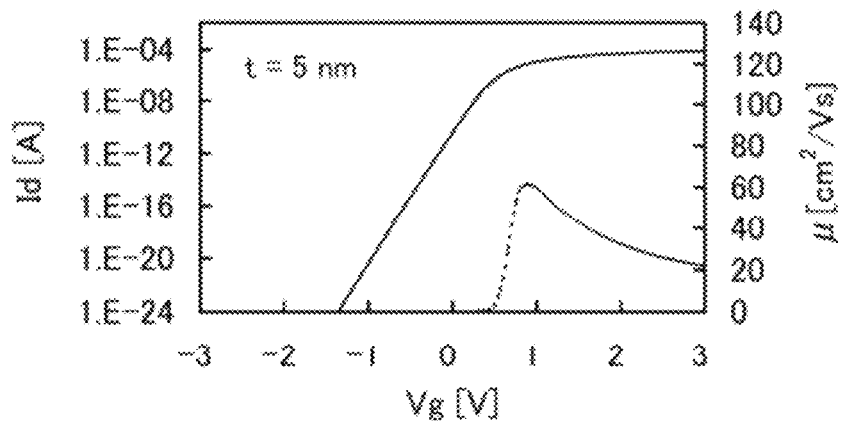

FIGS. 19A to 19C show the gate voltage $V_g$ dependence of the drain current $I_d$ (a solid line) and the mobility μ (a dotted line) of the transistor having the structure in FIG. 21B and an offset length Loff of 5 nm. The drain current $I_d$ is obtained by calculation under the assumption that the drain voltage is +1 V, and the mobility μ is obtained by calculation under the assumption that the drain voltage is +0.1 V. FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 nm.

Figure 20A:
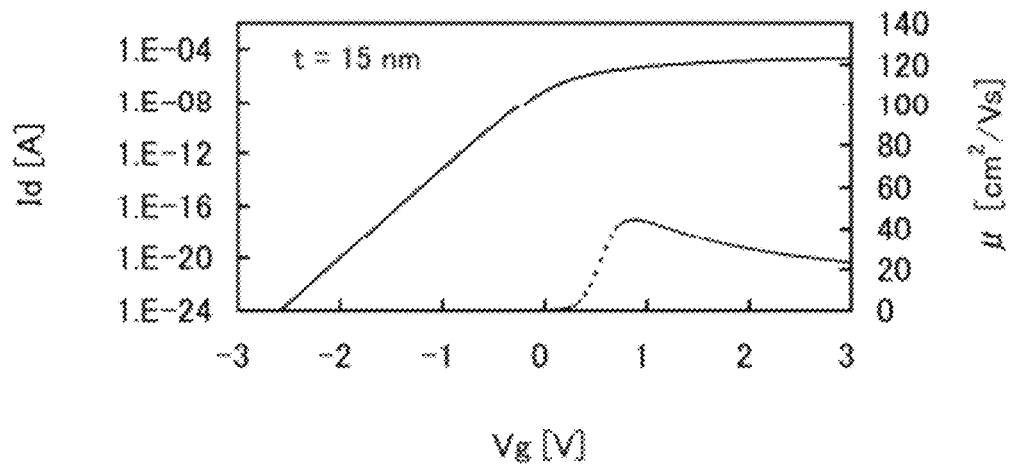
FIGS. 20A to 20C are graphs showing gate voltage dependence of drain current and mobility obtained by calculation.
Figure 20B:
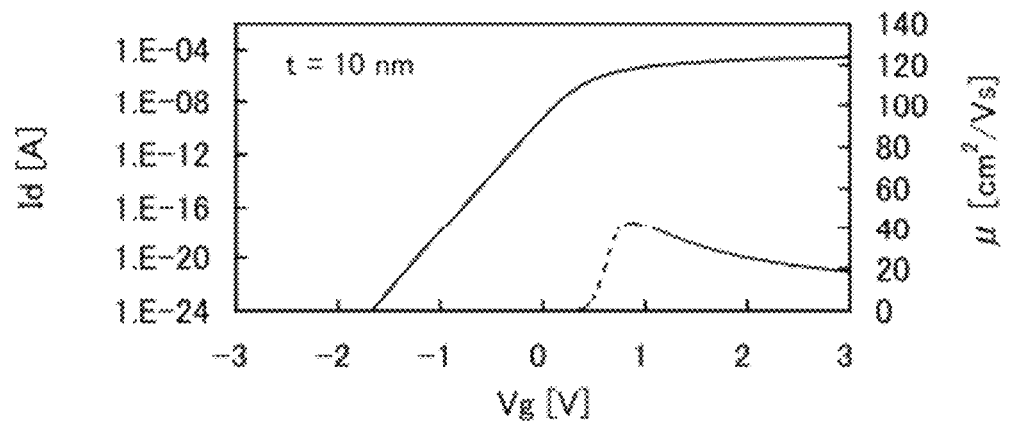
Figure 20C:
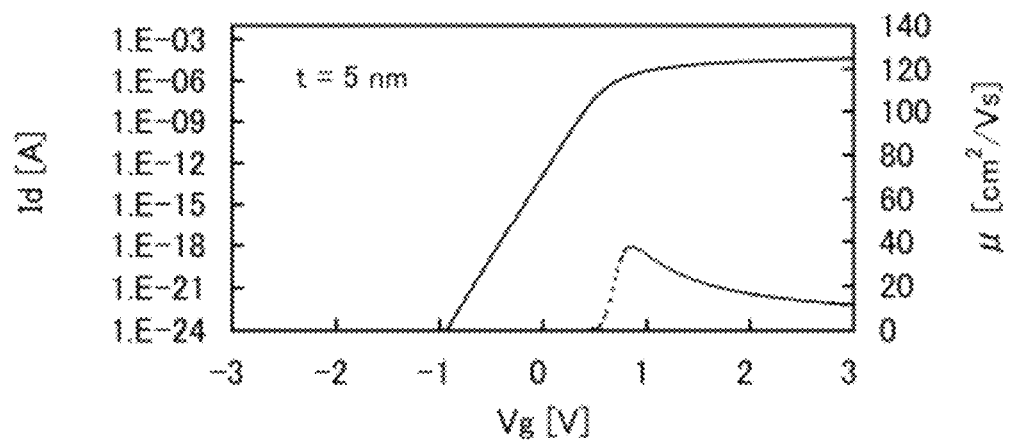
Figure 21A:
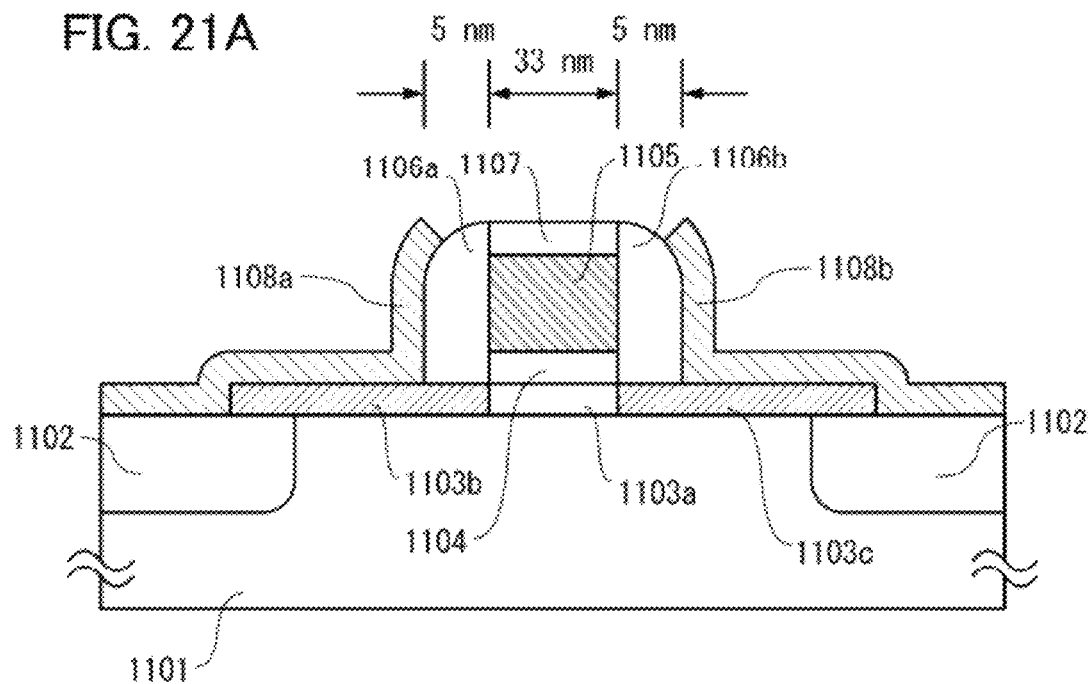
FIGS. 21A and 21B illustrate cross-sectional structures of transistors used for calculation.
Figure 21B:
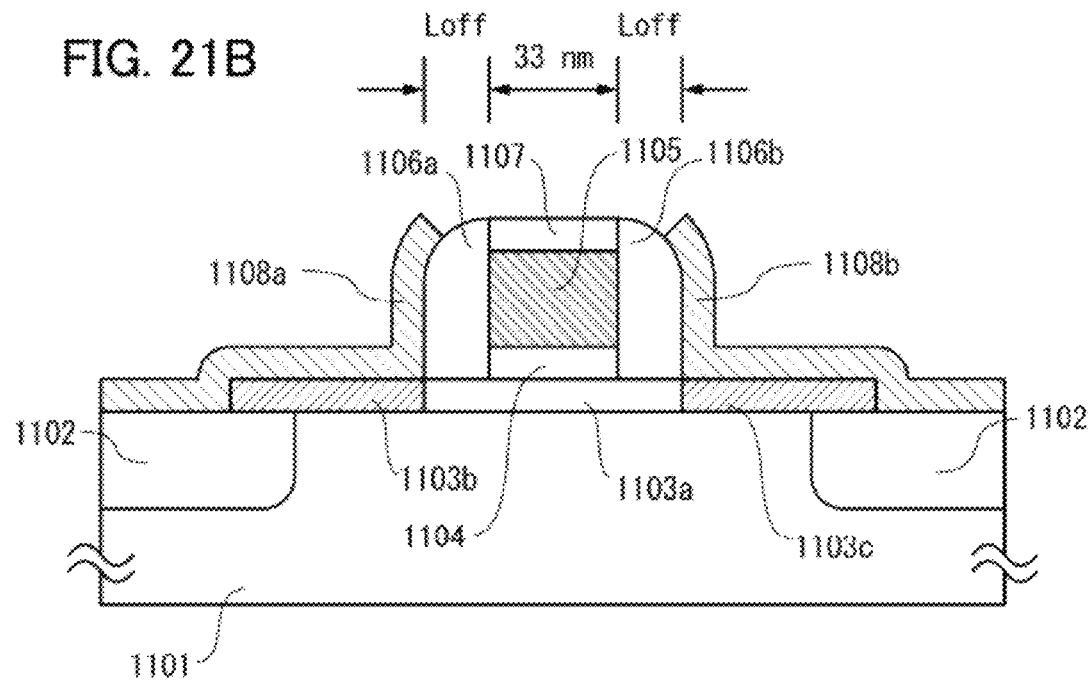

FIGS. 20A to 20C show the gate voltage dependence of the drain current $I_d$ (a solid line) and the mobility μ (a dotted line) of the transistor having the structure in FIG. 21B and an offset length Loff of 15 nm. The drain current $I_d$ is obtained by calculation under the assumption that the drain voltage is +1 V, and the mobility μ is obtained by calculation under the assumption that the drain voltage is +0.1 V. FIG. 20A shows the gate voltage dependence of the transistor in the case where the thickness of the gate insulating film is 15 nm, FIG. 20B shows that of the transistor in the case where the thickness of the gate insulating film is 10 nm, and FIG. 20C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 $cm^2/Vs$ in FIGS. 18A to 18C, approximately 60 $cm^2/Vs$ in FIGS. 19A to 19C, and approximately 40 $cm^2/Vs$ in FIGS. 20A to 20C; thus, the peak of the mobility μ is decreased as the offset length Loff is increased. Further, the same applies to the off-state current. The on-state current is also decreased as the offset length Loff is increased; however, the decrease in the on-state current is much more gradual than the decrease in the off-state current. Further, the graphs show that in either of the structures, the drain current exceeds 10 μA, which is required in a memory element and the like, at a gate voltage of around 1 V. Thus, when the transistor having high mobility is used as the transistor in the memory circuit described in the above embodiments, writing of the configuration data can be performed at high speed.

Embodiment 4

In this embodiment, as the transistor in which a channel formation region is formed in an oxide semiconductor, which is described in the above embodiments, a transistor in which a channel formation region is formed in an oxide semiconductor including In, Sn, and Zn as its main components will be particularly described.

A transistor in which a channel formation region is formed in an oxide semiconductor including In, Sn, and Zn as main components can have favorable characteristics by depositing the oxide semiconductor while a substrate is heated or by performing heat treatment after the oxide semiconductor film is formed. Note that a main component refers to an element included in a composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off. Hereinafter, result of various measurements of the transistor in which a channel formation region is formed in the oxide semiconductor film including In, Sn, and Zn as main components will be described.

Figure 22A:
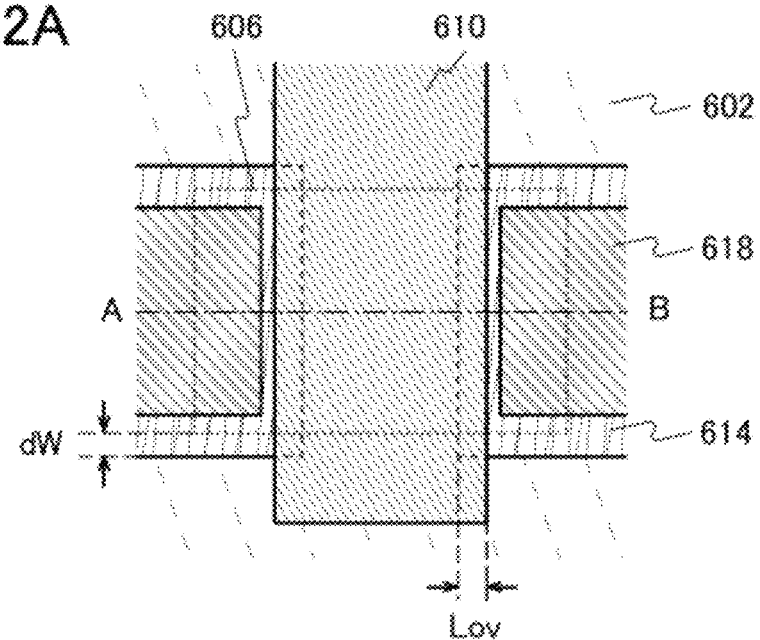
FIGS. 22A and 22B illustrate a top view and a cross-sectional structure of a transistor used for measurement.

First, a structure of the transistor used for the various measurements in this embodiment is described with reference to FIGS. 22A and 22B. FIG. 22A is a plan view of the transistor, and FIG. 22B is a cross-sectional view taken along dashed-dotted line A-B in FIG. 22A.

Figure 22B:
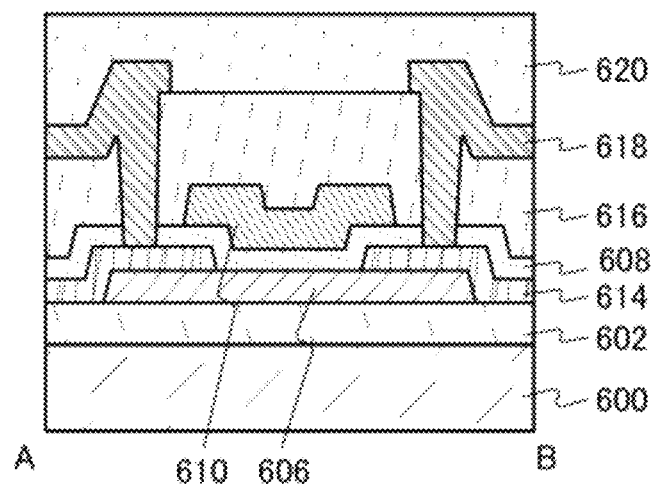

The transistor illustrated in FIG. 22B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 electrically connected to the pair of electrodes 614 through openings formed in the gate insulating film 608 and the interlayer insulating film 616; and a protective film 620 provided to cover the interlayer insulating film 616 and the wirings 618. The pair of electrodes 614 functions as a source electrode and a drain electrode of the transistor.

As the substrate 600, a glass substrate was used. As the base insulating film 602, a silicon oxide film was used. As the oxide semiconductor film 606, an In—Sn—Zn—O film was used. As the pair of electrodes 614, a tungsten film was used. As the gate insulating film 608, a silicon oxide film was used. The gate electrode 610 had a layered structure of a tantalum nitride film and a tungsten film. The interlayer insulating film 616 had a layered structure of a silicon oxynitride film and a polyimide film. The wirings 618 each had a layered structure in which a titanium film, an aluminum film, and a titanium film were formed in this order. As the protective film 620, a polyimide film was used.

Note that in the transistor having the structure illustrated in FIG. 22A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

Figure 23A:
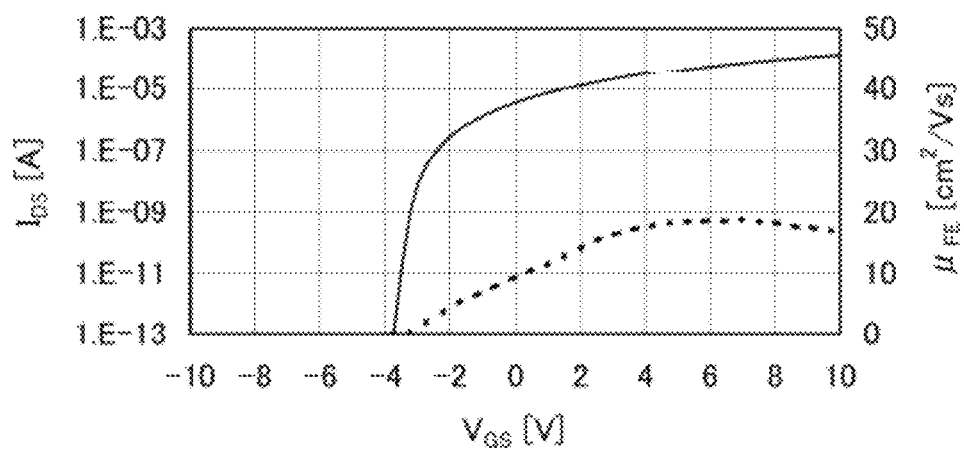
FIGS. 23A to 23C are graphs each showing characteristics of a transistor including an oxide semiconductor film.
Figure 23B:
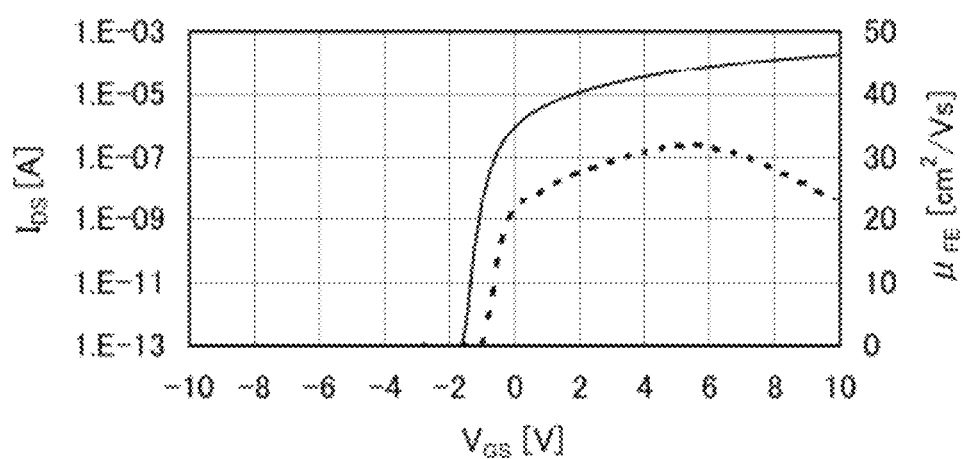
Figure 23C:
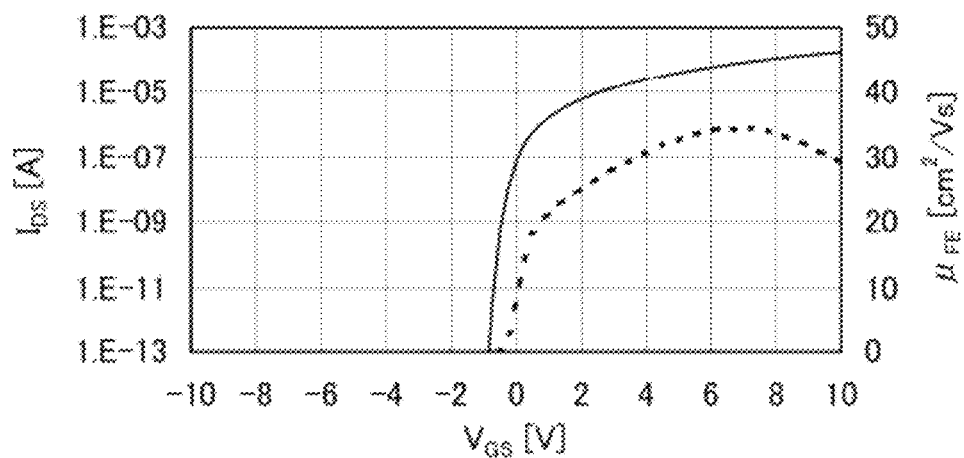

FIGS. 23A to 23C show the characteristics of the transistor in FIGS. 22A and 22B, which includes an oxide semiconductor film having a channel length L of 3 μm and a channel width W of 10 μm and a gate insulating film having a thickness of 100 nm. Note that $V_d$ was set to 10 V.

FIG. 23A is a graph showing characteristics of a transistor whose oxide semiconductor film including In, Sn, and Zn as main components is formed by a sputtering method without heating a substrate intentionally. The field-effect mobility of the transistor is 18.8 cm$^2$/Vsec. On the other hand, when the oxide semiconductor film including In, Sn, and Zn as main components is formed while the substrate is intentionally heated, the field-effect mobility can be improved. FIG. 23B shows characteristics of a transistor whose oxide semiconductor film including In, Sn, and Zn as main components is formed while a substrate is heated at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 23C shows characteristics of a transistor whose oxide semiconductor film including In, Sn, and Zn as main components is formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film which includes In, Sn, and Zn as main components and is formed without heating a substrate intentionally is used as a channel formation region, the threshold voltage tends to be shifted negatively. However, when the oxide semiconductor film formed while the substrate is intentionally heated is used, the problem of the negative shift of the threshold voltage can be solved. That is, the threshold voltage is shifted so that the transistor becomes normally off; this tendency can be confirmed by comparison between FIGS. 23A and 23B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be achieved by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at high temperature, the transistor can be normally off.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set to higher than or equal to $1\times10^{16}/cm^3$ and lower than or equal to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 24:
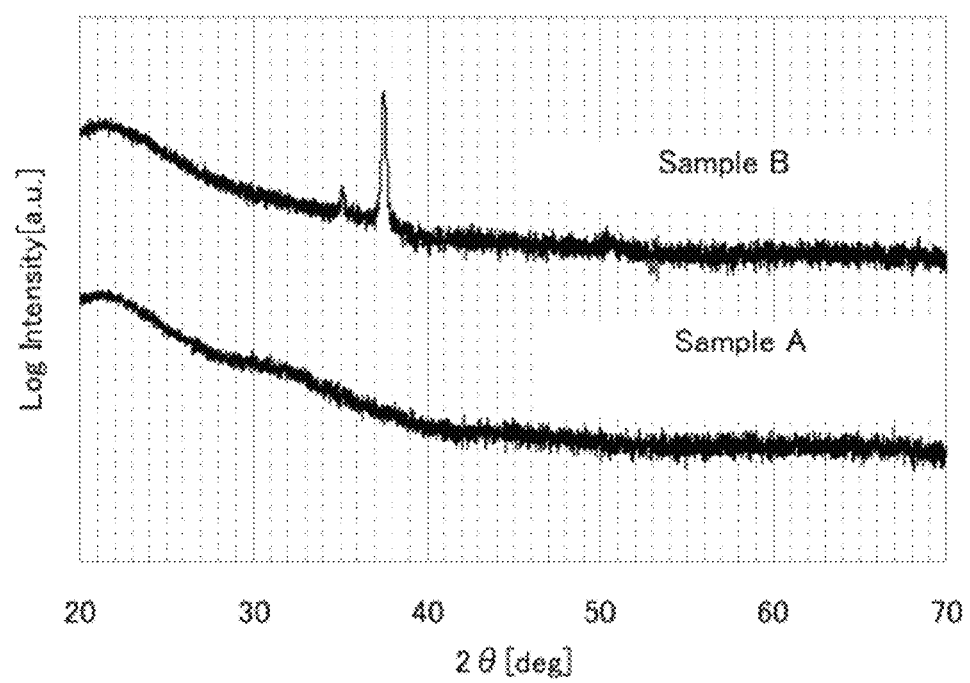
FIG. 24 shows XRD spectra of Sample A and Sample B.

FIG. 24 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or smaller. Here, the unit of the off-state current represents current per micrometer of a channel width.

Figure 25:
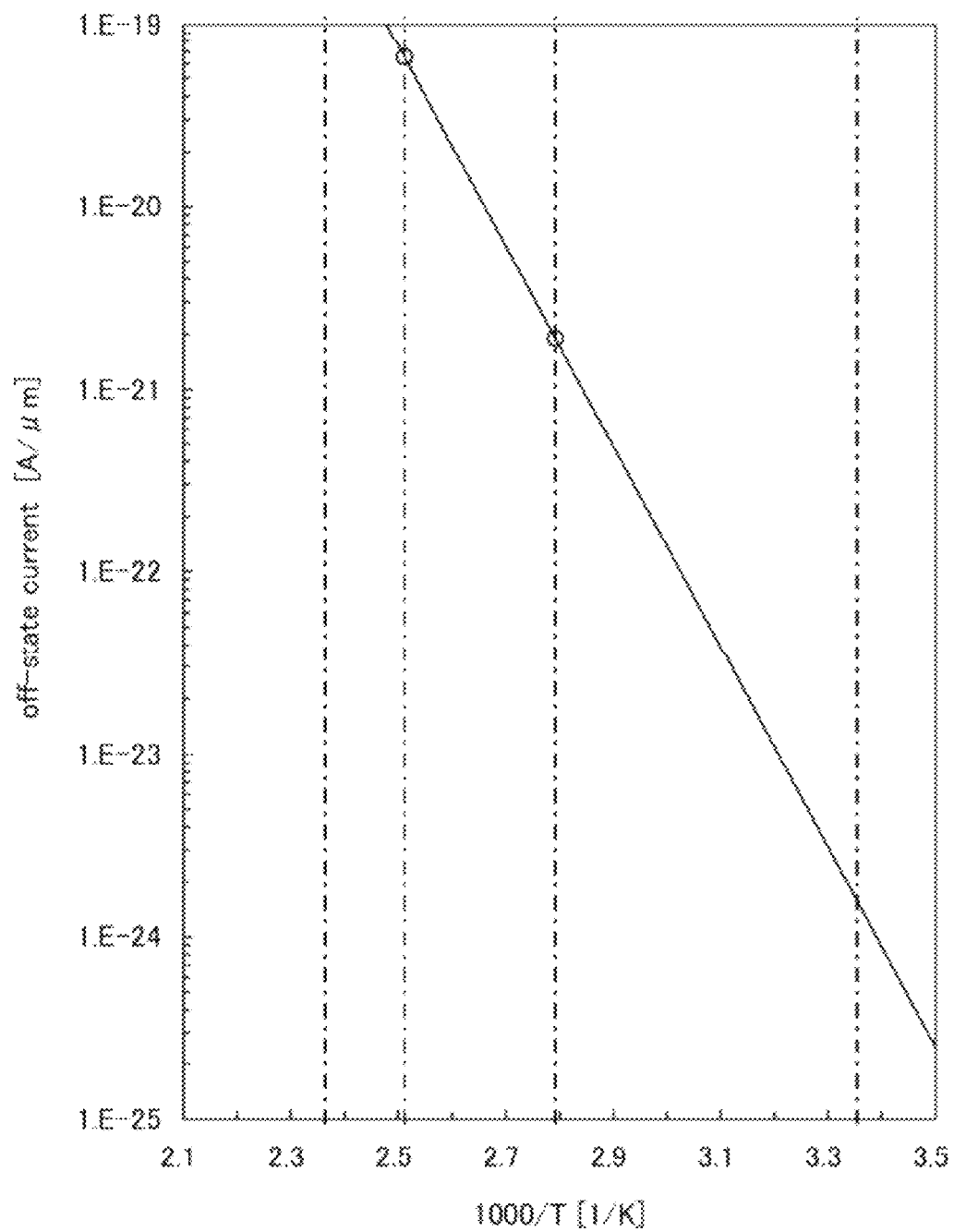
FIG. 25 is a graph showing a relation between off-state current and substrate temperature in measurement of a transistor.

FIG. 25 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 25, the off-state current was 0.1 aA/μm ($1\times10^{-19}$ A/μm) or smaller and 10 zA/μm ($1\times10^{-20}$ A/μm) or smaller when the substrate temperature was 125° C. and 85° C., respectively. The proportional relation between the logarithm of the off-state current and the inverse of the temperature suggests that the off-state current at room temperature (27° C.) is 0.1 zA/μm ($1\times10^{-22}$ A/μm) or smaller. Hence, the off-state current can be 1 aA/μm ($1\times10^{-18}$ A/μm) or smaller, 100 zA/μm ($1\times10^{-19}$ A/μm) or smaller, and 1 zA/μm ($1\times10^{-21}$ A/μm) or smaller at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electrical characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 3 μm on one side (total Lov of 6 μm), and dW of 0 μm. Note that $V_{ds}$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 26:
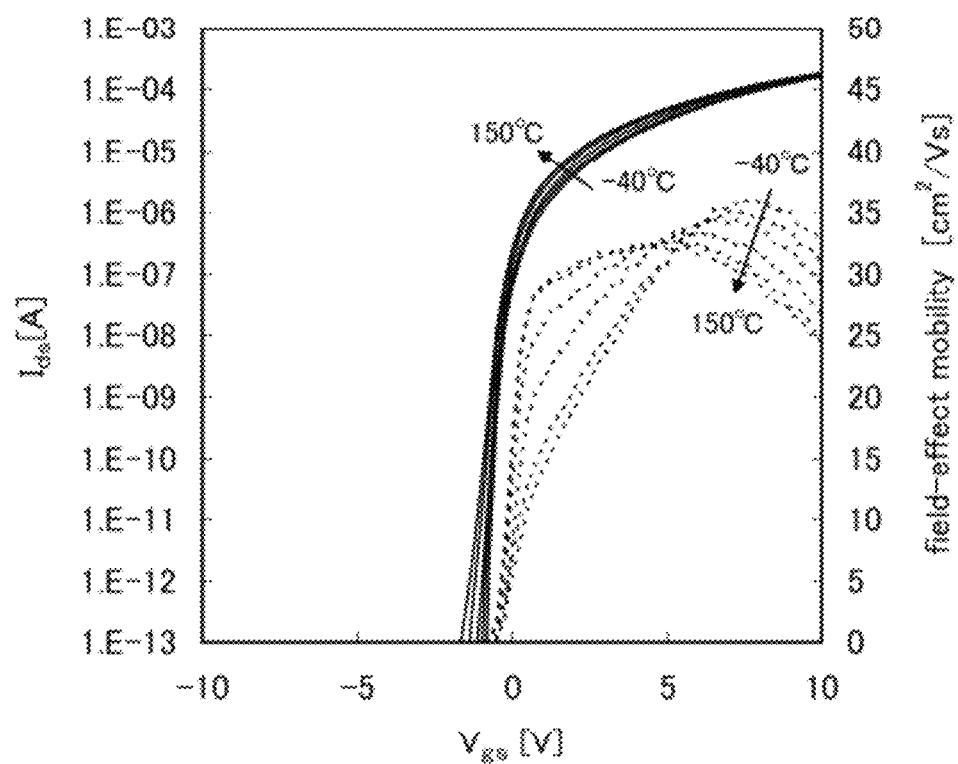
FIG. 26 shows $V_{gs}$ dependence of $I_{ds}$ and field-effect mobility.
Figure 27A:
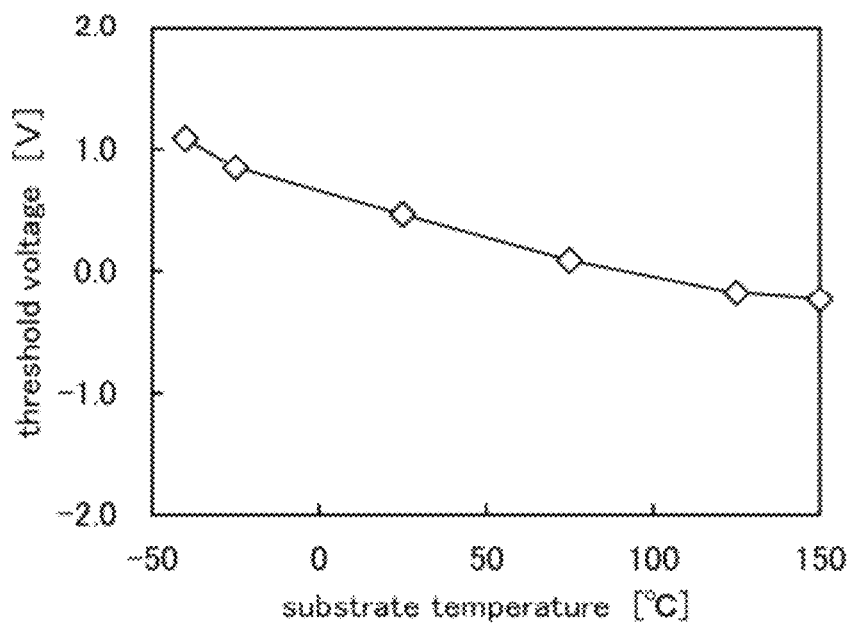
FIG. 27A is a graph showing a relation between substrate temperature and threshold voltage.

FIG. 26 shows the $V_{gs}$ dependence of $I_{ds}$ (a solid line) and field-effect mobility (a dotted line). FIG. 27A shows a relation between the substrate temperature and the threshold voltage, and FIG. 27B shows a relation between the substrate temperature and the field-effect mobility.

From FIG. 27A, it is found that the threshold voltage gets lower as the substrate temperature increases. Note that the threshold voltage is decreased from 1.09 V to −0.23 V in the range from −40° C. to 150° C.

Figure 27B:
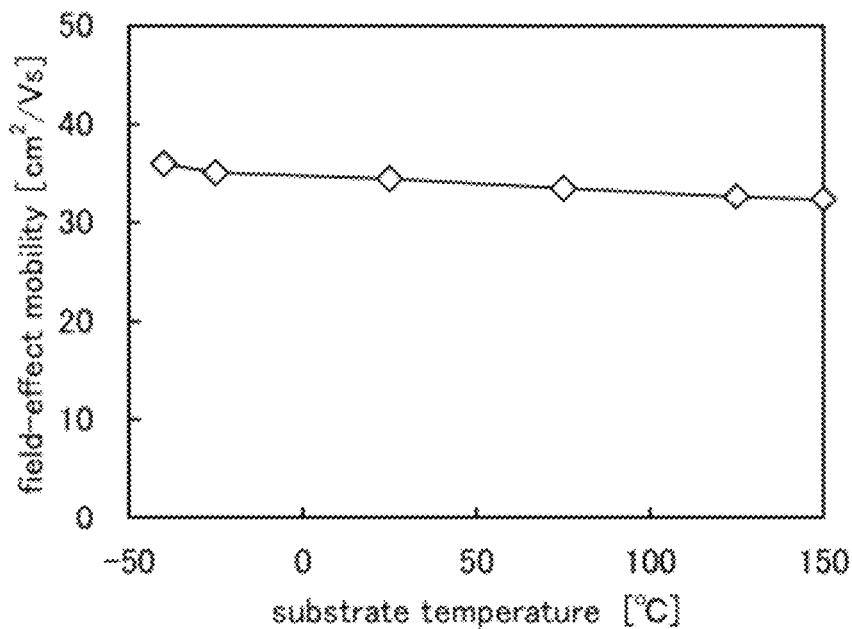
FIG. 27B is a graph showing a relation between substrate temperature and field-effect mobility.

From FIG. 27B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electrical characteristics is small in the above temperature range.

In a transistor in which such an oxide semiconductor containing In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or smaller, which can achieve on-state current needed for an LSI. For example, in an FET where L/W is 33 nm/40 nm, an on-state current of 12 μA or larger can flow when the gate voltage is 2.7 V and the drain voltage is 1.0 V.

Thus, a transistor having small off-state current is used as the transistor included in the memory circuit described in any of the above embodiments, whereby the configuration data can be held even when power supply voltage is not supplied. Thus, writing of configuration data after the power is supplied can be omitted, so that start-up time of an arithmetic circuit can be short. Accordingly, a programmable logic device in which power consumption is reduced by normally off-driving can be provided.

Thus, when a transistor having high mobility is used as the transistor included in the memory circuit described in any of the above embodiments, writing of the configuration data can be performed at high speed. With such characteristics, a programmable logic device can be provided without decreasing the operation speed even when a transistor including an oxide semiconductor is also provided in an integrated circuit formed using a Si semiconductor.

By the way, a magnetic tunnel junction element (an MTJ element) is known as a nonvolatile memory element. The MTJ element stores data in a low resistance state when the magnetization directions of ferromagnetic films provided above and below an insulating film are parallel, and stores data in a high resistance state when the magnetization directions of the ferromagnetic films are anti-parallel. Therefore, the principles of the MTJ element and the memory element including an oxide semiconductor in this embodiment are completely different from each other. Table 2 shows comparison between the MTJ element and the memory element in this embodiment.

TABLE 2

|  |  | Spintronics (MTJ element) | OS/Si |
|---|---|---|---|
| 1) | Heat Resistance | Curie temperature | Process temperature at 500° C. (reliability at 150° C.) |
| 2) | Driving Method | Current driving | Voltage driving |
| 3) | Writing Principle | Changing spin direction of magnetic body | Turning on/off FET |
| 4) | Si LSI | Suitable for bipolar LSI (MOS LSI is preferable for high integration because bipolar LSI is unsuitable for high integration. Note that W becomes larger.) | Suitable for MOS LSI |
| 5) | Overhead | Large (because of high Joule heat) | Smaller than overhead of the MTJ element by 2 to 3 or more orders of magnitude (because of charging and discharging of parasitic capacitance) |
| 6) | Nonvolatility | Utilizing spin | Utilizing low off-state current |
| 7) | Read Number | Without limitation | Without limitation |
| 8) | 3D Conversion | Difficult (at most two layers) | Easy (the number of layers is limitless) |
| 9) | Integration Degree (F$^2$) | 4 F$^2$ to 15 F$^2$ | Depends on the number of layers stacked in 3D conversion (it is necessary to ensure heat resistance in process of forming upper OS FET) |
| 10) | Material | Magnetic rare-earth element | OS material |
| 11) | Cost per Bit | High | Low (might be slightly high depending on OS material) |
| 12) | Resistance to Magnetic Field | Low | High |

The MTJ element is disadvantageous in that magnetic properties are lost when the temperature is the Curie temperature or higher because a magnetic material is used. Further, the MTJ element is compatible with a silicon bipolar device because current drive is employed. However, a silicon bipolar device is unsuitable for high integration. Furthermore, the MTJ element has a problem in that power consumption is increased by an increase in memory capacity, though the MTJ element consumes an extremely small amount of current during data writing.

In principle, the MTJ element has low resistance to a magnetic field, so that the magnetization direction is likely to change when the MTJ element is exposed to a high magnetic field. Further, it is necessary to control magnetic fluctuation due to nanoscaling of a magnetic body used for the MTJ element.

In addition, a rare earth element is used for the MTJ element; thus, it requires special attention to incorporate a process of forming the MTJ element in a process of forming a silicon semiconductor that avoids metal contamination. Further, the material cost per bit of the MTJ element is expensive.

On the other hand, the memory element including an oxide semiconductor in this embodiment has an element structure and an operation principle which are similar to those of a silicon MOSFET except that the region in which the channel is formed includes a metal oxide. Further, the memory element including an oxide semiconductor is not affected by a magnetic field, and does not cause soft errors. This shows that the memory element is highly compatible with a silicon integrated circuit.

This application is based on Japanese Patent Application serial no. 2011-121441 filed with Japan Patent Office on May 31, 2011, the entire contents of which are hereby incorporated by reference.

What is claimed is:

1. A semiconductor device comprising:
  an arithmetic circuit comprising:
    a first logic circuit;
    a second logic circuit;
    a first transistor; and
    a memory circuit; and
  a power supply control circuit,
  wherein the arithmetic circuit is configured to operate in accordance with configuration data stored in the memory circuit,
  wherein the first transistor is configured to change electrical connection between the first logic circuit and the second logic circuit in accordance with the configuration data,
  wherein the power supply control circuit is configured to control supply of a power supply voltage to the arithmetic circuit,
  wherein the memory circuit is configured to hold the configuration data while the power supply control circuit stops the supply of the power supply voltage to the arithmetic circuit, and
  wherein the memory circuit comprises a second transistor comprising a channel formation region formed in an oxide semiconductor layer,
  wherein a first terminal of the second transistor is electrically connected to a gate of the first transistor, and
  wherein a voltage corresponding to the configuration data is held in the gate of the first transistor while the power supply control circuit stops the supply of the power supply voltage to the arithmetic circuit.

2. The semiconductor device according to claim 1, wherein the power supply control circuit is configured to control the supply of the power supply voltage to the arithmetic circuit in accordance with data on use frequency of the arithmetic circuit.

3. The semiconductor device according to claim 1, wherein the power supply control circuit is configured to control the supply of the power supply voltage to the arithmetic circuit in accordance with data on last use of the arithmetic circuit.

4. The semiconductor device according to claim 1, wherein the power supply control circuit is configured to control the supply of the power supply voltage to the arithmetic circuit in accordance with data on use frequency of the arithmetic circuit and data on last use of the arithmetic circuit.

5. The semiconductor device according to claim 1, wherein the power supply control circuit is configured to control the supply of the power supply voltage to the arithmetic circuit in accordance with whether the configuration data is first configuration data or not.

6. The semiconductor device according to claim 1, wherein the semiconductor device is a programmable logic device.

7. A semiconductor device comprising:
  a first arithmetic circuit comprising a first memory circuit;
  a second arithmetic circuit comprising a second memory circuit; and
  a power supply control circuit;
  wherein the first arithmetic circuit is configured to operate in accordance with first configuration data stored in the first memory circuit,
  wherein the second arithmetic circuit is configured to operate in accordance with second configuration data stored in the second memory circuit,
  wherein the power supply control circuit is configured to control supply of a power supply voltage to the first arithmetic circuit and the second arithmetic circuit,
  wherein the first memory circuit is configured to hold the first configuration data while the power supply control circuit stops the supply of the power supply voltage to the first arithmetic circuit,
  wherein the second memory circuit is configured to hold the second configuration data while the power supply control circuit stops the supply of the power supply voltage to the second arithmetic circuit,
  wherein the power supply control circuit is configured to restart the supply of the power supply voltage to the first arithmetic circuit when the first configuration data is third configuration data,
  wherein the first arithmetic circuit comprises a first transistor,
  wherein the first memory circuit comprises a second transistor comprising a channel formation region formed in an oxide semiconductor layer,
  wherein a first terminal of the second transistor is electrically connected to a gate of the first transistor, and
  wherein a voltage corresponding to the first configuration data is held in the gate of the first transistor while the power supply control circuit stops the supply of the power supply voltage to the first arithmetic circuit.

8. The semiconductor device according to claim 7, wherein the power supply control circuit is configured to restart the supply of the power supply voltage to the second arithmetic circuit when the first configuration data is not the third configuration data and the second configuration data is the third configuration data.

9. The semiconductor device according to claim 8,
  wherein the power supply control circuit is configured to restart the supply of the power supply voltage to the second arithmetic circuit when the first configuration data is not the third configuration data and the second configuration data is not the third configuration data, and
  wherein the second memory circuit is configured to store the third configuration data after restarting the supply of the power supply voltage to the second arithmetic circuit.

10. The semiconductor device according to claim 9, wherein use frequency of the second arithmetic circuit is less than use frequency of the first arithmetic circuit.

11. The semiconductor device according to claim 9, wherein a time passing since last use of the second arithmetic circuit is longer than a time passing since last use of the first arithmetic circuit.

12. The semiconductor device according to claim 9, wherein use frequency of the second arithmetic circuit is less than use frequency of the first arithmetic circuit and a time passing since last use of the second arithmetic circuit is longer than a time passing since last use of the first arithmetic circuit.

13. The semiconductor device according to claim 9, wherein the semiconductor device is a programmable logic device.

14. A semiconductor device comprising:
a first arithmetic circuit comprising a first memory circuit;
a second arithmetic circuit comprising a second memory circuit;
a third arithmetic circuit comprising a third memory circuit; and
a power supply control circuit,
wherein the first arithmetic circuit is configured to operate in accordance with first configuration data stored in the first memory circuit,
wherein the second arithmetic circuit is configured to operate in accordance with second configuration data stored in the second memory circuit,
wherein the third arithmetic circuit is configured to operate in accordance with third configuration data stored in the third memory circuit,
wherein the power supply control circuit is configured to control supply of a power supply voltage to the first arithmetic circuit, the second arithmetic circuit, and the third arithmetic circuit,
wherein the first memory circuit is configured to hold the first configuration data while the power supply control circuit stops the supply of the power supply voltage to the first arithmetic circuit,
wherein the second memory circuit is configured to hold the second configuration data while the power supply control circuit stops the supply of the power supply voltage to the second arithmetic circuit,
wherein the third memory circuit is configured to hold the third configuration data while the power supply control circuit stops the supply of the power supply voltage to the third arithmetic circuit,
wherein the second memory circuit is configured to store the first configuration data when same arithmetic processing is repeated in the first arithmetic circuit,
wherein the first arithmetic circuit comprises a first transistor,
wherein the first memory circuit comprises a second transistor comprising a channel formation region formed in an oxide semiconductor layer,
wherein a first terminal of the second transistor is electrically connected to a gate of the first transistor, and
wherein a voltage corresponding to the first configuration data is held in the gate of the first transistor while the power supply control circuit stops the supply of the power supply voltage to the first arithmetic circuit.

15. The semiconductor device according to claim 14, wherein use frequency of the second arithmetic circuit is less than use frequency of the third arithmetic circuit.

16. The semiconductor device according to claim 14, wherein a time passing since last use of the second arithmetic circuit is longer than a time passing since last use of the third arithmetic circuit.

17. The semiconductor device according to claim 14, wherein use frequency of the second arithmetic circuit is less than use frequency of the third arithmetic circuit and a time passing since last use of the second arithmetic circuit is longer than a time passing since last use of the third arithmetic circuit.

18. The semiconductor device according to claim 14, wherein the semiconductor device is a programmable logic device.

* * * * *